US009749557B2

(12) United States Patent
Oike et al.

(10) Patent No.: US 9,749,557 B2
(45) Date of Patent: Aug. 29, 2017

(54) SOLID-STATE IMAGE PICKUP DEVICE IN WHICH CHARGES OVERFLOWING A MEMORY DURING A CHARGE TRANSFER PERIOD ARE DIRECTED TO A FLOATING DIFFUSION AND METHOD OF DRIVING SAME

(71) Applicant: Sony Corporation, Tokyo (JP)

(72) Inventors: Yusuke Oike, Kanagawa (JP); Yorito Sakano, Kanagawa (JP); Keiji Mabuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 74 days.

(21) Appl. No.: 14/703,213

(22) Filed: May 4, 2015

(65) Prior Publication Data
US 2015/0237272 A1 Aug. 20, 2015

Related U.S. Application Data

(62) Division of application No. 13/312,430, filed on Dec. 6, 2011, now Pat. No. 9,054,009.

(30) Foreign Application Priority Data

Dec. 15, 2010 (JP) ................................. 2010-279507

(51) Int. Cl.
H01L 27/00 (2006.01)
H04N 5/353 (2011.01)
H04N 5/369 (2011.01)

(52) U.S. Cl.
CPC ......... H04N 5/3535 (2013.01); H04N 5/3698 (2013.01); H04N 5/3532 (2013.01)

(58) Field of Classification Search
CPC ........ H01L 27/14654; H01L 27/14656; H04N 5/37452

(Continued)

(56) References Cited

U.S. PATENT DOCUMENTS 6,091,793 A 7/2000 Kamashita
7,800,675 B2 9/2010 Shah
(Continued)

FOREIGN PATENT DOCUMENTS

JP 1999-177076 7/1999
JP 2006-311515 11/2006
(Continued)

OTHER PUBLICATIONS

Japanese Office Examination Report issued in connection with related Japanese Patent Application No. JP2010-279507 dated Jun. 3, 2014.

Primary Examiner — Thanh Luu
(74) Attorney, Agent, or Firm — Chip Law Group

(57) ABSTRACT

A CMOS image sensor has an image array as a matrix of unit pixels each including at least a photodiode, a memory for holding a charge stored in the photodiode, a floating diffusion region for converting the charge in the memory into a voltage, a first transfer gate for transferring the charge from the photodiode to the memory, a second transfer gate for transferring the charge from the memory to the floating diffusion region, and a resetting transistor for resetting the charge in the floating diffusion region. The unit pixels are driven to set the potential of a potential barrier at a boundary between the memory and the floating diffusion region to a potential such that a charge overflowing the memory is transferred to the floating diffusion region, when the first transfer gate is turned on. The CMOS image sensor operates in a global shutter mode for capturing moving images.

6 Claims, 20 Drawing Sheets

(58) Field of Classification Search
USPC .................................... 250/208.1; 348/302
See application file for complete search history.

(56) References Cited

U.S. PATENT DOCUMENTS

| | | |
|---|---|---|
| 2009/0251582 A1 | 10/2009 | Oike |
| 2010/0090092 A1* | 4/2010 | Yamashita ........... H04N 5/3765 |
| | | 250/208.1 |
| 2010/0091157 A1 | 4/2010 | Yamashita et al. |
| 2011/0019045 A1* | 1/2011 | Lin ................... H01L 27/14612 |
| | | 348/296 |

FOREIGN PATENT DOCUMENTS

| | | |
|---|---|---|
| JP | 2007-053217 | 3/2007 |
| JP | 2009-268083 | 11/2009 |

* cited by examiner

SOLID-STATE IMAGE PICKUP DEVICE IN WHICH CHARGES OVERFLOWING A MEMORY DURING A CHARGE TRANSFER PERIOD ARE DIRECTED TO A FLOATING DIFFUSION AND METHOD OF DRIVING SAME

RELATED APPLICATION DATA

This application is a division of U.S. patent application Ser. No. 13/312,430 filed Dec. 6, 2011, the entirety of which is incorporated herein by reference to the extent permitted by law. The present application claims the benefit of priority to Japanese Patent Application No. JP 2010-279507 filed on Dec. 15, 2010 in the Japan Patent Office, the entirety of which is incorporated by reference herein to the extent permitted by law.

BACKGROUND

The present disclosure relates to a solid-state image pickup device, a method of driving a solid-state image pickup device, and an electronic instrument, and more particularly to a solid-state image pickup device, a method of driving a solid-state image pickup device, and an electronic instrument which are capable of operating in a global shutter mode for moving images.

Electronic shutters for image sensors which read charges stored in photodetectors through MOS transistors include a rolling shutter. Since the rolling shutter reads signal charges from each pixel or each pixel row at a time, all the pixels do not have the same exposure period in which charges are stored in the photodetectors. If a moving subject is imaged by an image pickup device with a rolling shutter, then the captured image tends to suffer a distortion.

There has been proposed a global shutter in which the pixels include respective charge holders and charges stored in photodetectors of the pixels are transferred altogether to the charge holders and held therein as signal charges until they are read from each pixel row at a time, thereby allowing all the pixels to share the same exposure period (e.g., see Japanese Patent Laid-open No. Hei 11-177076, hereinafter referred to as Patent Document 1).

A pixel which includes a photodetector and a charge holder has a smaller photodetector area and a smaller maximum charge quantity (saturated charge quantity) stored in the photodetector than a pixel which includes no charge holder. Even if the photodetector is designed for a larger area in the pixel which includes the photodetector and the charge holder, a charge quantity that is eventually handled as a signal charge by the pixel is up to the maximum charge quantity that is held by the charge holder which is of a smaller area. Consequently, it is desirable that the photodetector and the charge holder be designed for substantially the same maximum charge quantity (area). With the photodetector and the charge holder being designed for substantially the same maximum charge quantity (area), however, the maximum charge quantity is about one-half of the maximum charge quantity handled by the pixel which includes no charge holder. The pixel which includes the photodetector and the charge holder is thus unable to increase the charge quantity handled thereby.

One proposed solid-state image pickup device stores charges in a photodetector and a charge holder during an exposure period by providing an overflow path between the photodetector and the charge holder or having a potential barrier with a variable potential between the photodetector and the charge holder (e.g., see Japanese Patent Laid-open No. 2009-268083, hereinafter referred to as Patent Document 2). The proposed solid-state image pickup device makes it possible for the pixel which includes the photodetector and the charge holder to increase the charge quantity handled thereby up to the saturated charge quantity stored by the pixel which has no charge holder.

SUMMARY

An image sensor which operates in a global shutter mode as proposed in Patent Document 1 is capable of storing charges in an exposure period and reading signal charges from each pixel row at a time during the same period. Specifically, concurrent with reading signal charges held by charge holders from each pixel row at a time (hereinafter referred to as "readout scanning"), charges are discharged from and stored in the photodetectors of all the pixels. After the readout scanning for all pixel rows (one frame) is finished, the charges stored in the photodetectors are transferred altogether for all the pixels to the charge holders. The timing at which the photodetectors discharge the charges is set depending on the length of the exposure period. When a moving image is captured, therefore, the image sensor operates in the global shutter mode without impairing the frame rate that is determined depending on the rate of the readout scanning.

According to the pixel configuration proposed in Patent Document 2, charges are stored in the photodetector and the charge holder during the exposure period, and the charges held by the charge holder and a charge voltage converter are read from each pixel row at a time. Since the charge holder stores the charge in the exposure period and holds the charge for a pixel row to be read in the readout scanning period, the pixel configuration proposed in Patent Document 2 is unable to store the charge in the exposure period and perform the readout scanning during the same period.

As the charge is stored in the exposure period and the readout scanning is performed during different periods, the frame rate is lowered by the exposure period, tending to adversely affect the capture of a moving image.

Heretofore, therefore, it has been difficult for an image pickup device to operate in a global shutter mode for capturing moving images while at the same time maintaining the charge quantity handled thereby.

It is desirable to provide an image capturing technology for operating in a global shutter mode for capturing moving images while at the same time maintaining the charge quantity handled thereby.

According to a first embodiment of the present disclosure, there is provided a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from the photoelectric transducer to the charge holder, a second transfer element configured to transfer the charge from the charge holder to the charge voltage converter, and a resetter configured to reset the charge in the charge voltage converter; and a drive controller configured to control driving of the unit pixels;

wherein when the drive controller turns on the first transfer element, the drive controller applies, to the second transfer element, a first transfer voltage which sets the potential of a potential barrier at a boundary between the charge holder and the charge voltage converter to a first potential which is lower than the potential in a depleted state of a photodetector of the photoelectric transducer such that a charge overflowing the charge holder is transferred to the charge voltage converter.

Before the drive controller turns off the first transfer element, the drive controller may turn off the second transfer element from the first transfer voltage.

Before the drive controller turns off the first transfer element, the drive controller may apply, to the second transfer element, a second transfer voltage which sets the potential of the potential barrier at the boundary between the charge holder and the charge voltage converter to a second potential which is higher than the potential in the depleted state of the photodetector of the photoelectric transducer and which is lower than a potential barrier around the charge holder.

Before the drive controller turns off the second transfer element from the second transfer voltage, the drive controller may turn off the first transfer element.

According to a second embodiment of the present disclosure, there is provided a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from the photoelectric transducer to the charge holder, a second transfer element configured to transfer the charge from the charge holder to the charge voltage converter, and a resetter configured to reset the charge in the charge voltage converter; and a drive controller for controlling driving of the unit pixels;

wherein when the drive controller turns on the first transfer element, the drive controller applies, to the second transfer element, a transfer voltage which sets the potential of a potential barrier at a boundary between the charge holder and the charge voltage converter to a potential which is higher than the potential in a depleted state of a photodetector of the photoelectric transducer and which is lower than a potential barrier around the charge holder; and before the drive controller turns off the second transfer element from the transfer voltage, the drive controller turns off the first transfer element.

The drive controller may apply a negative voltage to the first transfer element and the second transfer element when the first transfer element and the second transfer element are turned off.

The solid-state image pickup device may further include a voltage reader configured to read a voltage corresponding to the charge in the charge voltage converter, and the drive controller may control driving of the unit pixels to enable the voltage reader to read a voltage as a first signal level corresponding to the charge in the charge voltage converter, read a voltage as a reset level corresponding to the charge in the charge voltage converter which is reset by the resetter, and read a voltage as a second signal level corresponding to the charge transferred from the charge holder to the charge voltage converter by the second transfer element after the charge in the charge voltage converter is reset by the resetter.

The solid-state image pickup device may further includes a calculator which calculates a first difference between the first signal level and the reset level which are read by the voltage reader and a second difference between the second signal level and the reset level which are read by the voltage reader, and adds the first difference and the second difference to each other.

The calculator may add the first difference and the second difference to each other if the second signal level is greater than a predetermined level.

According to the first embodiment of the present disclosure, there is also provided a method of driving a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from the photoelectric transducer to the charge holder, a second transfer element configured to transfer the charge from the charge holder to the charge voltage converter, and a resetter configured to reset the charge in the charge voltage converter; and a drive controller configured to control driving of the unit pixels;

wherein the method includes:

when the drive controller turns on the first transfer element, applying, to the second transfer element, a first transfer voltage which sets the potential of a potential barrier at a boundary between the charge holder and the charge voltage converter to a first potential which is lower than the potential in a depleted state of a photodetector of the photoelectric transducer such that a charge overflowing the charge holder is transferred to the charge voltage converter.

According to the second embodiment of the present disclosure, there is also provided a method of driving a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from the photoelectric transducer to the charge holder, a second transfer element configured to transfer the charge from the charge holder to the charge voltage converter, and a resetter configured to reset the charge in the charge voltage converter; and a drive controller configured to control driving of the unit pixels;

wherein the method includes:

when the drive controller turns on the first transfer element, applying, to the second transfer element, a transfer voltage which sets the potential of a potential barrier at a boundary between the charge holder and the charge voltage converter to a potential which is higher than the potential in a depleted state of a photodetector of the photoelectric transducer and which is lower than a potential barrier around the charge holder; and before the drive controller turns off the second transfer element from the transfer voltage, turning off the first transfer element.

According to the first embodiment of the present disclosure, there is provided an electronic instrument including:

a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from photoelectric transducer to the charge holder, a second transfer element configured to transfer the charge from the charge holder to the charge voltage converter, and a reseller configured to reset the charge in the charge voltage converter; and a drive controller configured to control driving of the unit pixels;

wherein when the drive controller turns on the first transfer element, the drive controller applies, to the second transfer element, a first transfer voltage which sets the potential of a potential barrier at a boundary between the charge holder and the charge voltage converter to a first potential which is lower than the potential in a depleted state of a photodetector of the photoelectric transducer such that a charge overflowing the charge holder is transferred to the charge voltage converter.

According to the second embodiment of the present disclosure, there is provided an electronic instrument including:

a solid-state image pickup device including:

a plurality of pixels each including at least a photoelectric transducer, a charge holder configured to hold a charge stored in the photoelectric transducer, a charge voltage converter configured to convert the charge held by the charge holder into a voltage, a first transfer element configured to transfer the charge from the photoelectric transducer to the charge holder, a second transfer element configured to transfer the charge from the charge holder to the charge voltage converter, and a resetter configured to reset the charge in the charge voltage converter; and a drive controller for controlling driving of the unit pixels;

wherein when the drive controller turns on the first transfer element, the drive controller applies, to the second transfer element, a transfer voltage which sets the potential of a potential barrier at a boundary between the charge holder and the charge voltage converter to a potential which is higher than the potential in a depleted state of a photodetector of the photoelectric transducer and which is lower than a potential barrier around the charge holder; and before the drive controller turns off the second transfer element from the transfer voltage, the drive controller turns off the first transfer element.

According to the first embodiment and the second embodiment of the present disclosure described above, it is possible for the solid-state image pickup device to operate in a global shutter mode for capturing moving images while at the same time maintaining the charge quantity handled thereby.

DETAILED DESCRIPTION OF THE PREFERRED EMBODIMENTS

Preferred embodiments of the present disclosure will be described in detail below with reference to the drawings.

[Configuration of a Solid-State Image Pickup Device]

Figure 1:
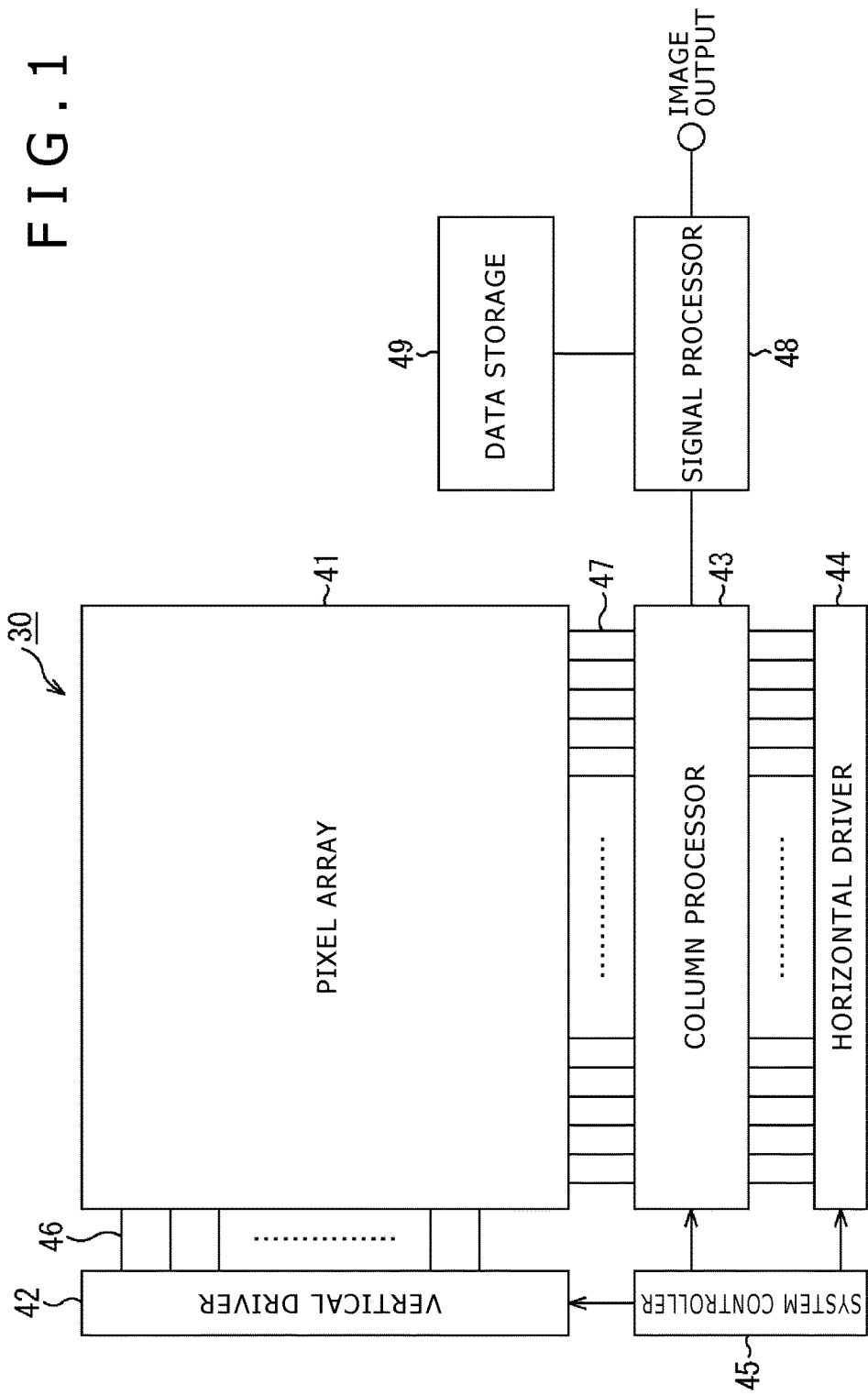
FIG. 1 is a block diagram of a solid-state image pickup device according to an embodiment of the present disclosure.

FIG. 1 is a block diagram of a CMOS (Complementary Metal Oxide Semiconductor) image sensor 30 as a solid-state image pickup device according to an embodiment of the present disclosure.

As shown in FIG. 1, the CMOS image sensor 30 includes a pixel array 41, a vertical driver 42, a column processor 43, a horizontal driver 44, and a system controller 45. The pixel array 41, the vertical driver 42, the column processor 43, the horizontal driver 44, and the system controller 45 are fabricated on a semiconductor substrate (chip), not shown.

The pixel array 41 includes a two-dimensional matrix of unit pixels (each illustrated as a unit pixel 50 in FIG. 2) arranged in rows and columns. Each of the unit pixels has a photoelectric transducer which generates a light charge having a charge quantity depending on the amount of incident light applied thereto and stores the generated light charge therein. The light charge having the charge quantity depending on the amount of incident light applied to the photoelectric transducer will hereinafter also be referred to as "charge," and the unit pixel as "pixel."

The pixel array 41 includes a plurality of pixel drive lines 46 extending horizontally in FIG. 1 along the respective rows of pixels and a plurality of vertical signal lines 47 extending vertically in FIG. 1 along the respective columns of pixels. The pixel drive lines 46 have ends connected to respective output terminals of the vertical driver 42 which corresponding respectively to the rows of pixels.

The CMOS image sensor 30 also includes a signal processor 48 and a data storage 49. The signal processor 48 and the data storage 49 may be in the form of an external signal processor, e.g., a DSP (Digital Signal Processor), mounted on a substrate separate from the semiconductor substrate of the CMOS image sensor 30, or may be software-implemented, or may be mounted on the semiconductor substrate of the CMOS image sensor 30.

The vertical driver 42, which includes a shift register, an address decoder, etc., serves to drive the pixel array 41 by driving all the pixels simultaneously or driving each row at a time. The vertical driver 42 includes a readout scanning system and a flush scanning system, or performs a batch flushing process and a batch transfer process, although the specific configuration is not shown.

The readout scanning system selectively scans the pixel array 41 successively over each row of unit pixels at a time in order to read signals from the unit pixels. In a row drive mode (rolling shutter mode), the flush scanning system flushes a row of unit pixels which is to be scanned by the readout scanning system at a time which is a shutter speed time earlier than the readout scanning process. In a global exposure mode (global shutter mode), the batch flushing process flushes the unit pixels at a time which is a shutter speed time earlier than the batch transfer process.

When a row of unit pixels to be scanned is flushed, unwanted charges are cleared from the photoelectric transducers of the unit pixels, i.e., the photoelectric transducers are reset. When the unwanted charges are cleared from the photoelectric transducers of the unit pixels, i.e., the photoelectric transducers are reset, a so-called electronic shutter mode is performed. The electronic shutter mode refers to a mode for discarding light charges from photoelectric transducers and starting to expose the photoelectric transducers to light, i.e., starting to store light charges in the photoelectric transducers.

A signal that is read by a reading process carried out by the readout scanning system represents the amount of incident light applied after a preceding reading process or a preceding electronic shutter mode. In the row drive mode, a period from the readout timing of the preceding reading process or the flush timing of a preceding electronic shutter mode until the readout timing of the present reading process serves as a storage period (exposure period) in which light charges are stored in unit pixels. In the global exposure mode, a period from the batch flushing process to the batch transfer process serves as a storage period (exposure period).

Pixel signals that are output from the unit pixels of a row that is selectively scanned by the vertical driver 42 are supplied respectively through the vertical signal lines 47 to the column processor 43. The column processor 43 perform a predetermined signal processing process on the pixel signals that are output from the unit pixels of the selected row through the vertical signal lines 47 along the columns of pixels of the pixel array 41, and temporarily holds the processed pixel signals.

Specifically, the column processor 43 performs at least a noise removing process, e.g., a CDS (Correlated Double Sampling) process, as the signal processing process. The CDS process performed by the column processor 43 removes reset noise and fixed-pattern noise inherent in the pixels, e.g., threshold variations of amplifying transistors. The column processor 43 may also have an A/D (analog-to-digital) converting function, in addition to the noise removing function, to output processed signals as digital signals.

The horizontal driver 44, which includes a shift register, an address decoder, etc., serves to successively select unit circuits in the column processor 43 which correspond to the columns of pixels. When the horizontal driver 44 successively selects the unit circuits in the column processor 43, the pixel signals that are processed by the column processor 43 are successively output to the signal processor 48.

The system controller 45 includes a timing generator for generating various timing signals. The system controller 45 controls the vertical driver 42, the column processor 43, and the horizontal driver 44 based on the various timing signals generated by the timing generator.

The signal processor 48, which has at least an adding function, performs various signal processing process, including an adding process, on the pixel signals that are output from the column processor 43. The data storage 49 temporarily stores data that are required by the signal processing process to be performed by the signal processor 48.

[Structure of a Unit Pixel]

The specific structure of the unit pixels 50 arranged in a matrix in the pixel array 41 shown in FIG. 1 will described below.

Figure 2:
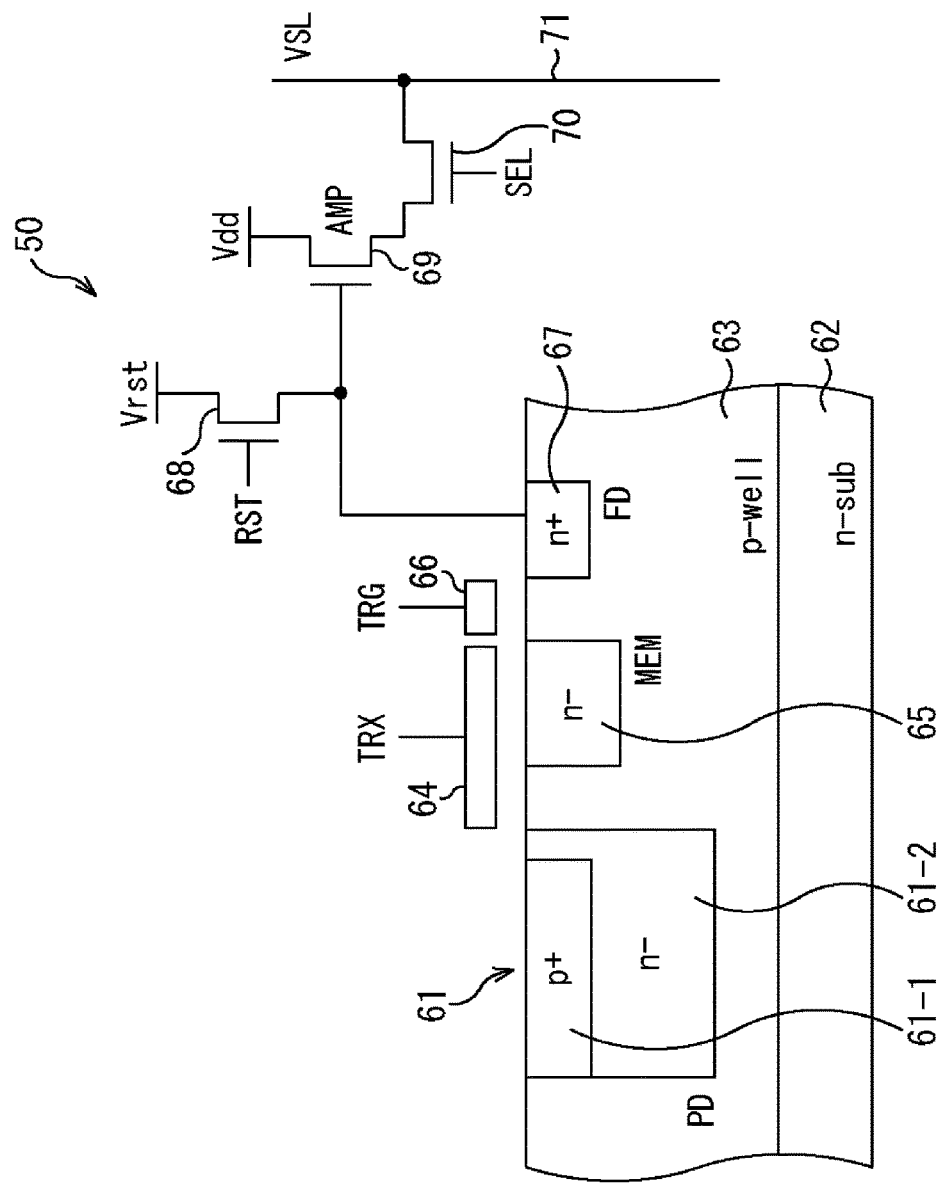
FIG. 2 is a schematic diagram showing a configurational example of a unit pixel.

FIG. 2 is a schematic diagram showing a configurational example of each unit pixel 50.

As shown in FIG. 2, the unit pixel 50 includes a photodiode (PD) 61, for example, as the photoelectric transducer. The photodiode 61 is a buried photodiode including a p-type layer 61-1 and an n-type buried layer 61-2 which are buried in a p-type well layer 63 on an n-type substrate 62, the p-type layer 61-1 being disposed in the surface of the p-type well layer 63. The n-type buried layer 61-2 is of an impurity concentration such that the impurity is depleted when the charge is discharged therefrom.

The unit pixel 50 includes, in addition to the photodiode 61, a first transfer gate 64 and a memory (MEM) 65.

The first transfer gate 64 transfers a charge which is photoelectrically converted by the photodiode 61 and stored in the photodiode 61, in response to a drive signal TRX applied to a gate electrode thereof. The memory 65, which is shielded from light, is formed as an n-type buried channel below the first transfer gate 64. The memory 65 stores the charge transferred from the photodiode 61 by the first transfer gate 64. Since the memory 65 is formed as a buried channel, it prevents a dark current from being produced at an Si—SiO$_2$ interface, for a better image quality.

The memory 65 is modulated by the drive signal TRX that is applied to the gate electrode of the first transfer gate 64. Specifically, when the drive signal TRX is applied to the gate electrode of the first transfer gate 64, the potential of the memory 65 becomes greater to make the saturated charge quantity thereof greater than if the memory 65 is not modulated.

At the time the first transfer gate 64 is turned off, the saturated charge quantity of the memory 65 is designed to be smaller than the saturated charge quantity of the photodiode 61.

The unit pixel 50 further includes a second transfer gate 66 and a floating diffusion (FD) region 67.

The second transfer gate 66 transfers the charge stored in the memory 65 to the floating diffusion region 67 in response to a drive signal TRG applied to the gate electrode of the second transfer gate 66.

The floating diffusion region 67, which is a charge voltage converter in the form of an n-type layer, converts the charge transferred from the memory 65 by the second transfer gate 66 into a voltage.

The unit pixel 50 further includes a resetting transistor 68, an amplifying transistor 69, and a selecting transistor 70. In FIG. 2, each of the resetting transistor 68, the amplifying transistor 69, and the selecting transistor 70 is an n-channel MOS transistor. However, the resetting transistor 68, the amplifying transistor 69, and the selecting transistor 70 may be of any conductivity types in combination.

The resetting transistor 68 is connected between a power supply Vrst and the floating diffusion region 67, and resets the floating diffusion region 67 in response to a drive signal RST applied to the gate electrode of the resetting transistor 68. The amplifying transistor 69 has a drain electrode connected to a power supply Vdd and a gate electrode connected to the floating diffusion region 67. The amplifying transistor 69 reads a voltage on the floating diffusion region 67.

The selecting transistor 70 has a drain electrode connected to the source electrode of the amplifying transistor 69 and a source electrode connected to a vertical signal line 71. The selecting transistor 70 selects the unit pixel 50 from which to read a pixel signal in response to a drive signal SEL applied to the gate electrode thereof. The selecting transistor 70 may alternatively be connected between the power supply Vdd and the amplifying transistor 69.

One or more of the resetting transistor 68, the amplifying transistor 69, and the selecting transistor 70 may be dispensed with depending on how a pixel signal is read from the unit pixel 50.

The unit pixel 50 shown in FIG. 2 and other configuration examples thereof to be described later include n-type buried channels in the p-type well layer 63. However, they may include buried channels of the opposite conductivity type, in which case all potentials to be described later are reversed.

The CMOS image sensor 30 thus constructed operates in the global shutter mode (global exposure) by starting to expose all the pixels simultaneously, ending to expose all the pixels simultaneously, and transferring charges stored in the photodiodes 61 to the memories 65 that are shielded from light. The global shutter mode makes it possible for the CMOS image sensor 30 to capture distortion-free images in an exposure period which is shared by all the pixels.

All the pixels in the present embodiment refer to all pixels that appear in images, and exclude dummy pixels. If the pixels are small enough to ignore time differences or image distortions, then a plurality of rows of pixels, e.g., several tens of rows of pixels, rather than all the pixels, may be scanned at a time.

Hereinafter, when the drive signals TRX, TRG, RST, SEL are applied respectively to the gate electrode of the first transfer gate 64, the gate electrode of the second transfer gate 66, the gate electrode of the resetting transistor 68, and the gate electrode of the selecting transistor 70, these drive signals are referred to as being "turned on," or the first transfer gate 64, the second transfer gate 66, the resetting transistor 68, and the selecting transistor 70 are referred to as being "turned on." When the drive signals TRX, TRG, RST, SEL are not applied respectively to the gate electrode of the first transfer gate 64, the gate electrode of the second transfer gate 66, the gate electrode of the resetting transistor 68, and the gate electrode of the selecting transistor 70, these drive signals are referred to as being "turned off," or the first transfer gate 64, the second transfer gate 66, the resetting transistor 68, and the selecting transistor 70 are referred to as being "turned off."

[Driving Sequence Example of Unit Pixels]

A driving sequence example of the unit pixels 50 in the CMOS image sensor 30 in the global shutter mode will be described below with reference to a timing chart shown in FIG. 3.

During a period from time T1 to time t2, when the drive signals RST, TRX, TRG are turned on in all the pixels, the charges stored in the photodiode 61, the memory 65, and the floating diffusion region 67 are discharged. After the charges are discharged, the drive signals TRX, TRG, RST are turned off in the order named. The charge from the memory 65 is reliably discharged to the floating diffusion region 67 without going back to the photodiode 61.

During a period from time T2 to time T3, concurrently in all the pixels, after the charges are discharged, a charge produced by new light from a subject is stored in the photodiode 61.

During a period from time T3 to time T4, concurrently in all the pixels, the charge stored in the photodiode 61 is transferred to the memory 65. During the period from time T3 to time T4, when the drive signals RST, TRG are turned on to initialize (reset) the charges stored in the memory 65 and the floating diffusion region 67.

Thereafter, during a period from time t1 to time t4, the first transfer gate 64 is turned on, and the second transfer gate 66 is turned on to set the potential of a potential barrier at the boundary between the memory 65 and the floating diffusion region 67 (hereinafter referred to as "MEM-FD boundary potential") to a given potential, thereby transferring the charge stored in the photodiode 61 to the memory 65 and the floating diffusion region 67.

Details of operation of the unit pixel 50 during the period from time t1 through time t4 in the timing chart shown in FIG. 3 will be described below with reference to FIG. 4.

Figure 4:
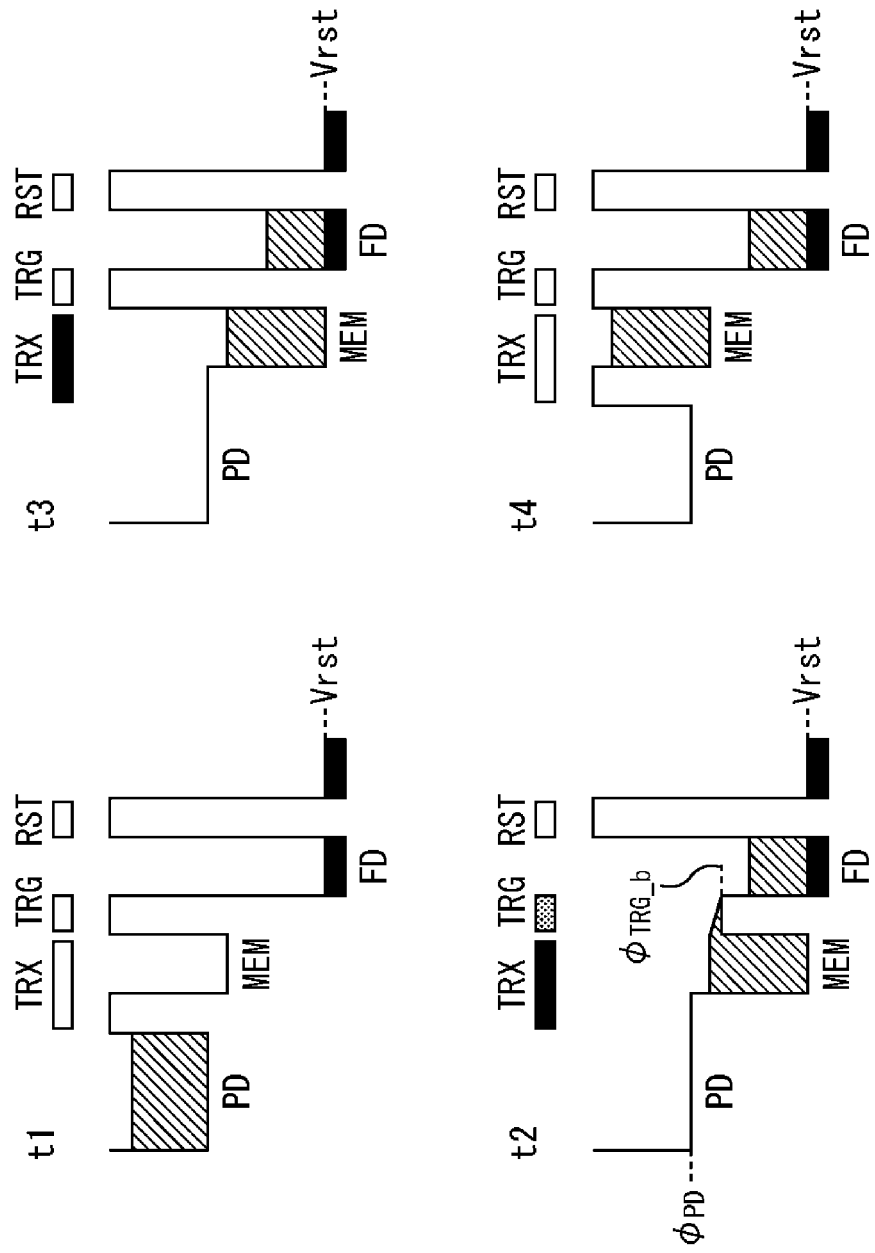
FIG. 4 is a potential diagram illustrative of a driving sequence example of the unit pixel.

FIG. 4 is a potential diagram showing potentials of the unit pixel 50 respectively at times t1 through t4. Quadrangles below the letters TRX, TRG, RST illustrate the states of the drive signals TRX, TRG, RST. A solid quadrangle indicates that the corresponding drive signal is turned on, and a blank quadrangle indicates that the corresponding drive signal is turned off. A stippled quadrangle indicates that the corresponding drive signal has a voltage between the voltage which is applied to turn it on and the voltage which is applied to turn it off.

At time t1, the unit pixel 50 is in a state wherein the photodiode 61 stores a charge and the memory 65 and the floating diffusion region 76 are initialized (reset).

Figure 3:
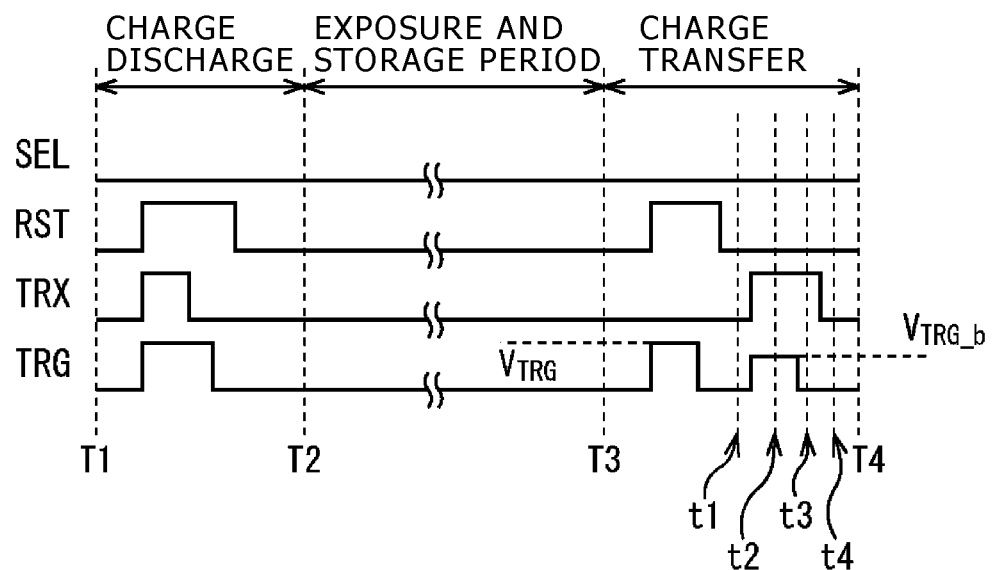
FIG. 3 is a timing chart illustrative of a driving sequence example of the unit pixel.

Then, the drive signal TRX (the first transfer gate 64) is turned on, and a pulse having a voltage $V_{TRG\_b}$ is applied as the drive signal TRG to the second transfer gate 66 (FIG. 3). The voltage $V_{TRG\_b}$ is a voltage which is lower than a voltage $V_{TRG}$ of the drive signal TRG which is turned on, and is a voltage which sets the MEM-FD boundary potential to a potential $\phi_{TRG\_b}$ that is lower than the potential $\phi_{PD}$ of the photodiode 61 in a depleted state, as shown in FIG. 4.

At time t2, in the unit pixel 50, the potential of a potential barrier at the boundary between the photodiode 61 and the memory 65 (hereinafter referred to as "PD-MEM boundary potential") and the potential of the memory 65 are lowered to transfer the charge stored in the photodiode 61 to the memory 65 and to cause a charge in excess of the charge quantity (maximum charge quantity) that can be held by the memory 65 to flow into the floating diffusion region 67.

Incidentally, in FIG. 3, the timing at which the drive signal TRX is turned on and the timing at which the drive signal TRG of the voltage $V_{TRG\_b}$ is applied occur simultaneously. However, the timing at which the drive signal TRG is applied may be later than the timing at which the drive signal TRX is turned on. In such a case, as the drive signal TRG is applied before the potential of the memory 65 becomes sufficiently low (sufficiently deep), an unnecessary charge is prevented from flowing into, i.e., being transferred to, the floating diffusion region 67.

Then, when the drive signal TRG (the second transfer gate 66) is turned off, the MEM-FD boundary potential returns to the level at time t1 at time t3. Thereafter, when the drive signal TRX (the first transfer gate 64) is turned off, the PD-MEM boundary potential and the potential of the memory 65 return to the levels at time t1 at time t4.

The voltages of the drive signals TRX, TRG at the time they are turned off may be set to negative voltages for thereby reducing dark currents that are produced in the surfaces of the photodiode 61 and the memory 65.

Although the voltage $V_{TRG\_b}$ has been described as being lower than the voltage $V_{TRG}$ above, the voltage $V_{TRG\_b}$ may be higher than the voltage $V_{TRG}$ in order to set the MEM-FD boundary potential to the potential $\phi_{TRG\_b}$ that is lower than the potential $\phi_{PD}$ of the photodiode 61 in the depleted state.

In a high-luminance environment wherein a sufficient amount of incident light is applied to the CMOS image sensor 30, the charge stored in the photodiode 61 is large depending on the amount of incident light. In a low-luminance environment wherein a small amount of incident light is applied to the CMOS image sensor 30, the charge stored in the photodiode 61 is smaller than the charge stored in the high-luminance environment, as shown in FIG. 5.

Figure 5:
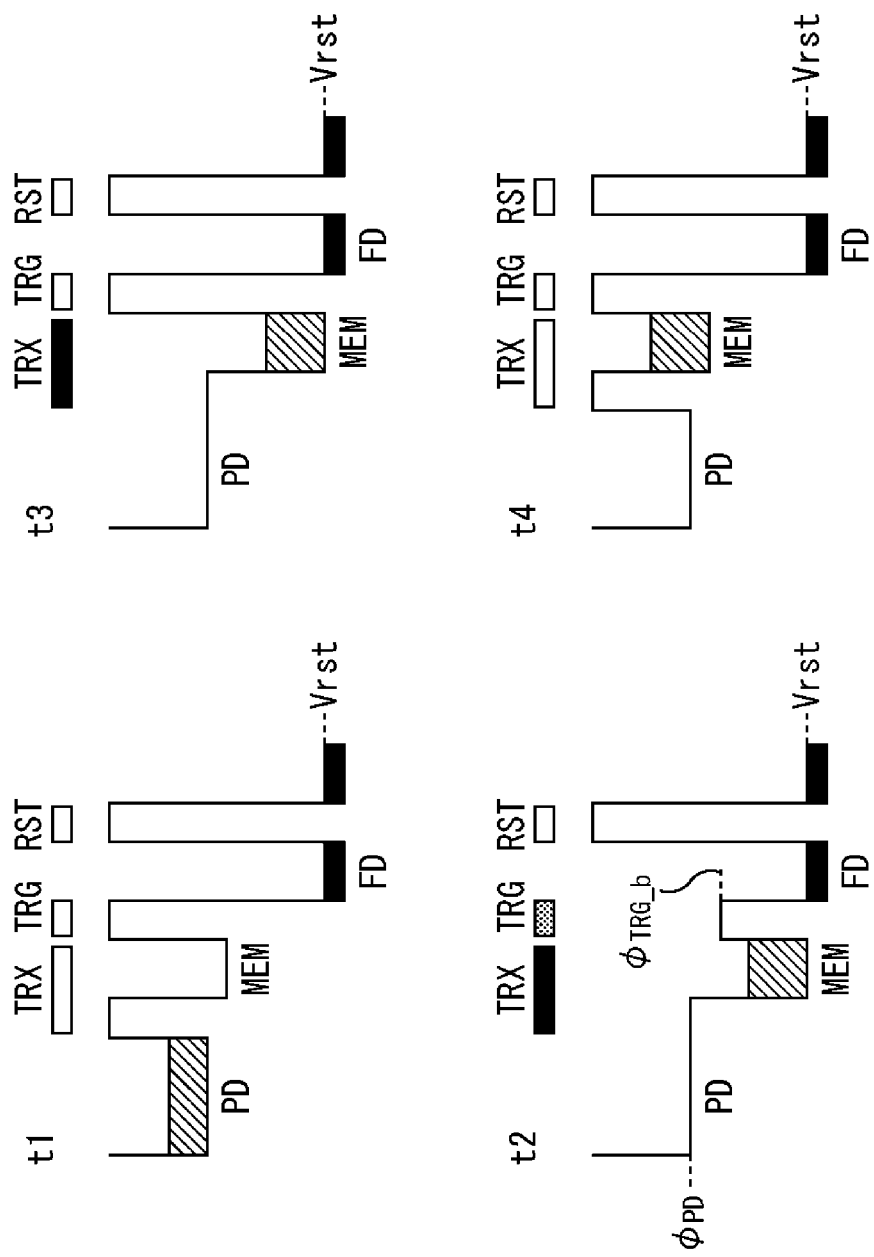
FIG. 5 is a potential diagram illustrative of a driving sequence example of the unit pixel.

FIG. 5 is a potential diagram showing potentials of the unit pixel 50 respectively at times t1 through t4 in FIG. 3 in a low-luminance environment. In FIG. 5, the drive signals TRX, TRG, RST transit, i.e., the first transfer gate 64, the second transfer gate 66, and the resetting transistor 68 of the unit pixel 50 operate, in the same manner as with FIG. 4, and hence they will not be described in detail below.

As shown in FIG. 5, in the low-luminance environment, when the drive signal TRX is turned on after the charge is stored in the photodiode 61 at time t1 and a pulse having a voltage $V_{TRG\_b}$ is applied as the drive signal TRG to the second transfer gate 66, the charge stored in the photodiode 61 is transferred to the memory 65 at time t2. In FIG. 5, however, since the charge quantity of the charge stored in the photodiode 61 does not exceed the maximum charge quantity that can be held by the memory 65, no charge flows into, i.e., is transferred to, the floating diffusion region 67. As a result, the charge stored in the photodiode 61 is held by only the memory 65.

According to the above process, in the high-luminance environment, when the charge is transferred, the charge in excess of the saturated charge quantity of the memory 65 as a charge holder is held by the floating diffusion region 67 as a charge voltage converter. Specifically, after the charge stored in the photodiode 61 in an exposure period is transferred, it is held by the memory 65 and the floating diffusion region 67. At this time, since the memory 65 as a charge holder plays a role only to hold the charge, the CMOS image sensor 30 can store the charge in the exposure period and perform a readout scanning process during the same period in the global shutter mode. Even if the saturated charge quantity of the photodiode 61 is designed to be larger than saturated charge quantity of the memory 65, since the memory 65 and the floating diffusion region 67 store the charge, the charge quantity which is to be finally handled as a signal charge can be equalized to the saturated charge quantity of the photodiode 61. Accordingly, it is possible for the CMOS image sensor 30 to operate in the global shutter mode for capturing moving images while at the same time maintaining the charge quantity handled thereby.

In the readout scanning process to read signal charges from each row at a time, the signal level (voltage) corresponding to the charge held by the memory 65 (hereinafter referred to as "first signal level") and the signal level corresponding to the charge held by the floating diffusion region 67 (hereinafter referred to as "second signal level") are added to each other.

[Readout Process Example of Unit Pixels]

A driving sequence example of the unit pixel 50 in the readout scanning process to read signal charges from each row at a time will be described below with reference to a timing chart shown in FIG. 6.

When the drive signal SEL is turned on, a voltage depending on the charge held by the floating diffusion region 67 is read as a first signal level during a period from T11 to T12.

When the drive signal RST is turned on during a period from time T12 to time T13, the charge held by the floating diffusion region 67 is reset, i.e., discharged, by the resetting transistor 68. The charge remains reset until the drive signal SEL is turned off at time T14, during which time a voltage as a first reset level is read. The difference between the first signal level and the first reset level thus read is determined, and a CDS process for removing noise is performed to generate a noise-free first signal level.

Then, the drive signal SEL turned on again, after which the drive signal RST is turned on during a period from time T15 to time T16, causing the resetting transistor 68 to reset, i.e., initialize, the floating diffusion region 67. The floating diffusion region 67 remains reset until the drive signal TRG is turned on at T17, during which time a voltage as a second reset level is read.

When the drive signal TRG is turned on during a period from time T17 to time T18, the charge held by the memory 65 is transferred to the floating diffusion region 67 by the second transfer gate 66.

During a period from time T18 to time T19, a voltage depending on the charge held by the floating diffusion region 67 is read as a second signal level. The difference between the second reset level and the second signal level thus read is determined, and a CDS process for removing noise is performed to generate a noise-free second signal level.

The first signal level and the second signal level are added to each other by the column processor 43, and the sum signal is finally output as a pixel signal corresponding to the charge stored in the photodiode 61.

The floating diffusion region 67 as a charge voltage converter has a poorer charge holding capability than the memory 65 as a charge holder. Specifically, the signal level (the second signal level) corresponding to the charge held by the floating diffusion region 67 tends to contain more noise than the signal level (the first signal level) corresponding to the charge held by the memory 65.

In the readout scanning process, the first signal level and the second signal level are added to each other if the first signal level is greater than a predetermined level.

If the signal level (the first signal level) corresponding to the charge held by only the memory 65 is not greater than the predetermined level, then the second signal level which contains noise is not added to the first signal level. Consequently, noise is prevented from being added to a signal level which is read in a low-luminance environment wherein a high S/N (Signal-to-Noise) ratio is difficult to achieve, so that the quality of moving images captured in the low-luminance environment is prevented from being lowered.

If light shot noise is prevalent in a high-luminance environment wherein the amount of incident light is large, then the first signal level and the second signal level are added to each other. Even if noise is included in the second signal level, any deterioration of the quality of a captured image is not conspicuous.

Figure 6:
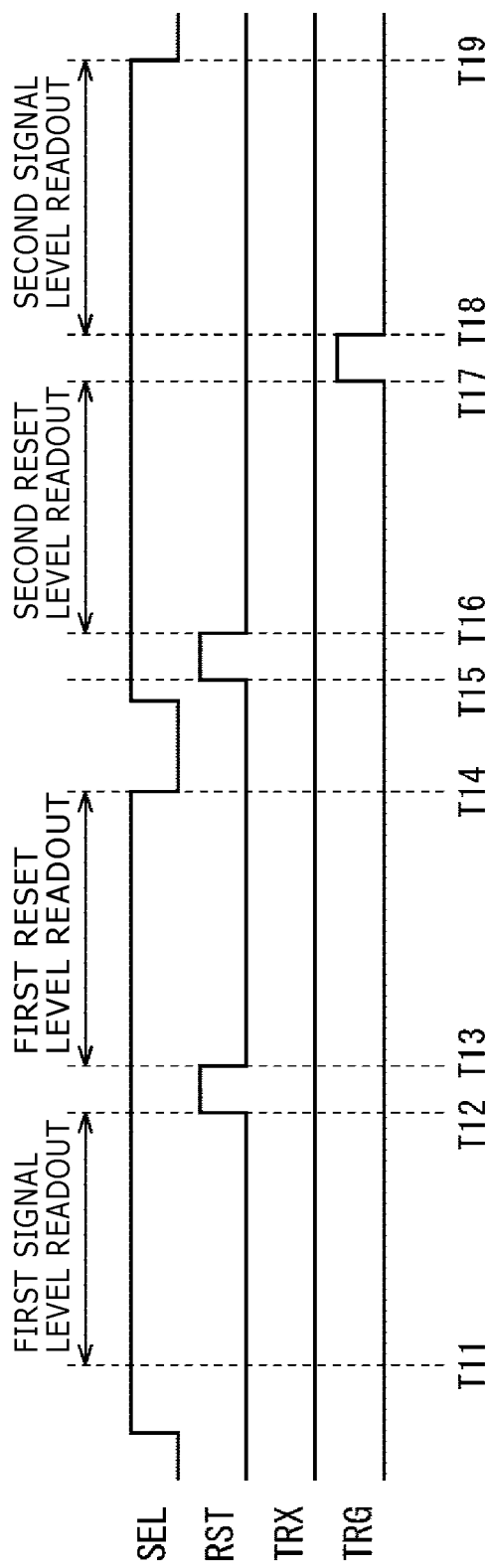
FIG. 6 is a timing chart illustrative of a readout sequence example of the unit pixel.

The readout scanning process described with reference to FIG. 6 is carried out in the same period as the exposure period described with reference to FIG. 3. Accordingly, the CMOS image sensor 30 can operate in the global shutter mode for moving images without impairing the frame rate that is determined depending on the rate of the readout scanning process.

Particularly in the high-luminance environment, as described above, when the charge is transferred, the charge in excess of the saturated charge quantity of the memory 65 as a charge holder is transferred to and held by the floating diffusion region 67. It is not necessary to add, for example, a capacitive element for holding the charge in excess of the saturated charge quantity of the memory 65 to the floating diffusion region 67, and a high conversion efficiency, i.e., a high efficiency with which to convert a charge into a voltage, can be achieved in reading signal charges. The high conversion efficiency makes noise relatively small in reading signal charges and hence makes it possible to increase the quality of captured images.

In the readout scanning process described with reference to FIG. 6, the floating diffusion region 67 is reset by the resetting transistor 68 when the second reset level is read. However, such a resetting process may be omitted.

[Another Readout Process Example of Unit Pixels]

Figure 7:
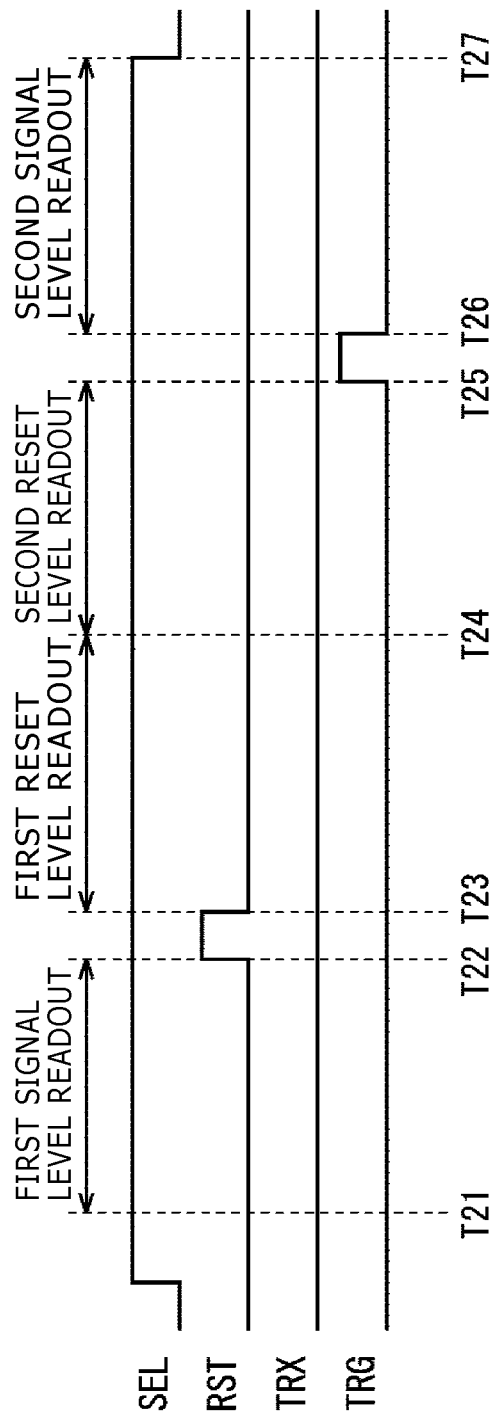
FIG. 7 is a timing chart illustrative of a readout sequence example of the unit pixel.

A driving sequence example of the unit pixel 50 in the readout scanning process wherein a resetting process is omitted in reading the second reset level will be described below with reference to a timing chart shown in FIG. 7.

In the timing chart shown in FIG. 7, operation sequences during periods from time T21 through time T24 and from time T25 through time T27 are identical to the operation sequences during the periods from time T11 through time T14 and from time T17 through time T19 in the timing chart shown in FIG. 6, and will not be described below.

A reset state during a period from time T24 to time T25, which is essentially identical to a reset state during a period from time T23 to time T24, continues until the drive signal TRG is turned on at time T25, during which time a voltage as a second reset level is read.

The difference between the second reset level thus read and a second signal level read during a period from time T26 to time T27 is determined, and a CDS process for removing noise is performed to generate a noise-free second signal level.

The noise-free first signal level and the noise-free second signal level are added to each other by the column processor 43, and the sum signal is finally output as a pixel signal corresponding to the charge stored in the photodiode 61.

In the readout scanning process described with reference to FIG. 7, the reset state at the time the first reset level is read and the reset state at the time the second reset level is read are essentially identical to each other. Therefore, these reset levels may be read in a single process.

[Still Another Readout Process Example of Unit Pixels]

Figure 8:
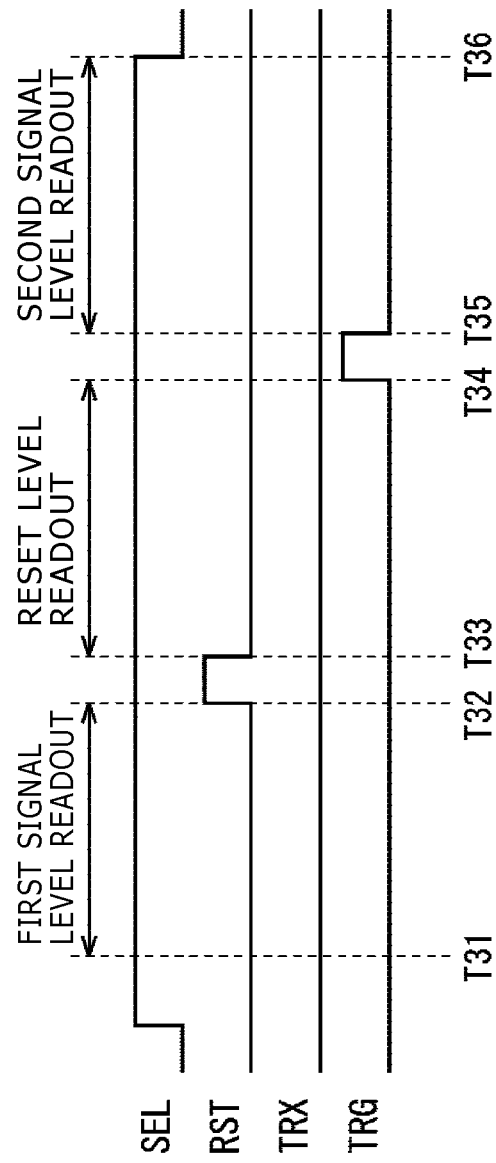
FIG. 8 is a timing chart illustrative of a readout sequence example of the unit pixel.

A driving sequence example of the unit pixel 50 in the readout scanning process wherein a single process for reading reset levels is carried out will be described below with reference to a timing chart shown in FIG. 8.

In the timing chart shown in FIG. 8, operation sequences from time T31 through time T33 and from time T34 through time T36 are identical to the operation sequences from time T21 through time T23 and from time T25 through time T27 in the timing chart shown in FIG. 7, and will not be described below.

A reset state during a period from time T33 to time T34 continues until the drive signal TRG is turned on at time T34, during which time a voltage as a first reset level and a second reset level (hereinafter simply referred to as "reset level") is read.

The difference between the reset level thus read and a first signal level read during a period from time T31 to time T32 is determined, and a CDS process for removing noise is performed to generate a noise-free first signal level.

The difference between the reset level thus read and a second signal level read during a period from time T35 to time T36 is determined, and a CDS process for removing noise is performed to generate a noise-free second signal level.

The noise-free first signal level and the noise-free second signal level are added to each other by the column processor 43, and the sum signal is finally output as a pixel signal corresponding to the charge stored in the photodiode 61.

The present disclosure is applicable to the structures of other unit pixels than the unit pixel according to the above embodiment described above. The structures of other unit pixels to which the present disclosure is applicable will be described below with reference to FIGS. 9 through 11, 14, and 15. Those parts shown in FIGS. 9 through 11, 14, and 15 which are identical to those shown in FIG. 2 are denoted by identical reference characters, and will not be described in detail below.

[Another Structure of a Unit Pixel]

Figure 9:
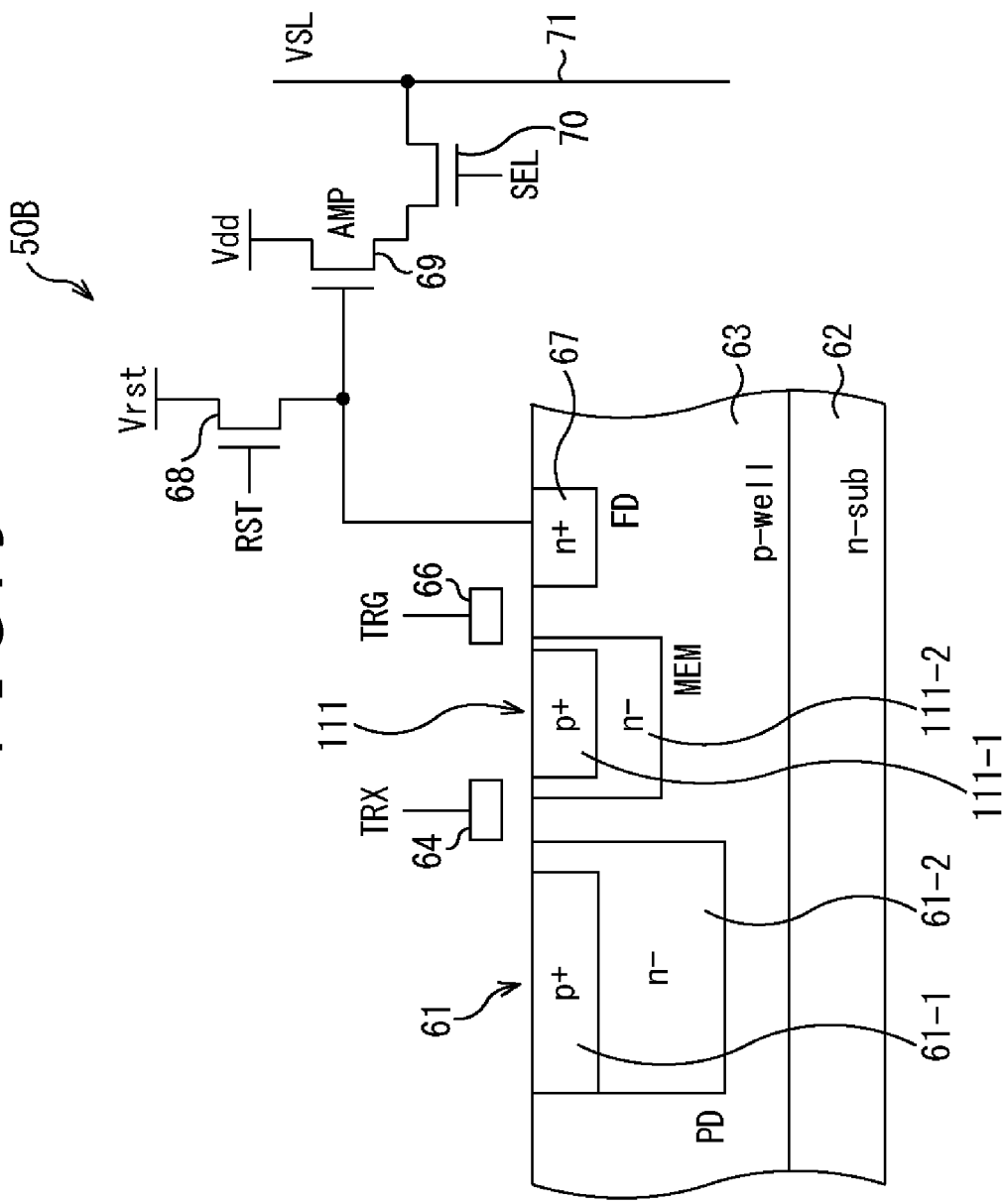
FIG. 9 is a schematic diagram showing another configurational example of a unit pixel.

FIG. 9 is a schematic diagram showing another configurational example of a unit pixel 50.

In the unit pixel 50B shown in FIG. 9, the gate electrode of the first transfer gate 64 is disposed above the p-type well layer 63 at the boundary between the photodiode 61 and a memory 111. The memory 111 includes an n-type diffusion region 111-2 buried in the p-type well layer 63 and a p-type layer 111-1 buried in the n-type diffusion region 111-2 in the surface of the p-type well layer 63.

The memory 111 which includes the n-type diffusion region 111-2 operates in the same way and offers the same advantages as the memory which includes the buried channel. Specifically, as the n-type diffusion region 111-2 is buried in the p-type well layer 63 and the p-type layer 111-1 is buried in the n-type diffusion region 111-2 in the surface of the p-type well layer 63, a dark current which is produced at an Si—SiO$_2$ interface is prevented from being stored in the n-type diffusion region 111-2 of the memory 111, resulting in an increase in the quality of captured images.

The impurity concentration of the n-type diffusion region 111-2 of the memory 111 should preferably be lower than the impurity concentration of the floating diffusion region 67. The impurity concentration thus set makes it possible to increase the efficiency with which the charge is transferred from the memory 111 to the floating diffusion region 67 by the second transfer gate 66. A CMOS image sensor incorporating unit pixels 50B thus constructed operates in the global shutter mode in the same manner and offers the same advantages as with the CMOS image sensor incorporating the unit pixels 50 shown in FIG. 2.

With the unit pixel 50B shown in FIG. 9, the memory 111 includes the buried n-type diffusion region 111-2. However, the memory 111 may be of a non-buried structure though the non-buried structure tends to generate a dark current in the memory 111.

[Still Another Structure of a Unit Pixel]

Figure 10:
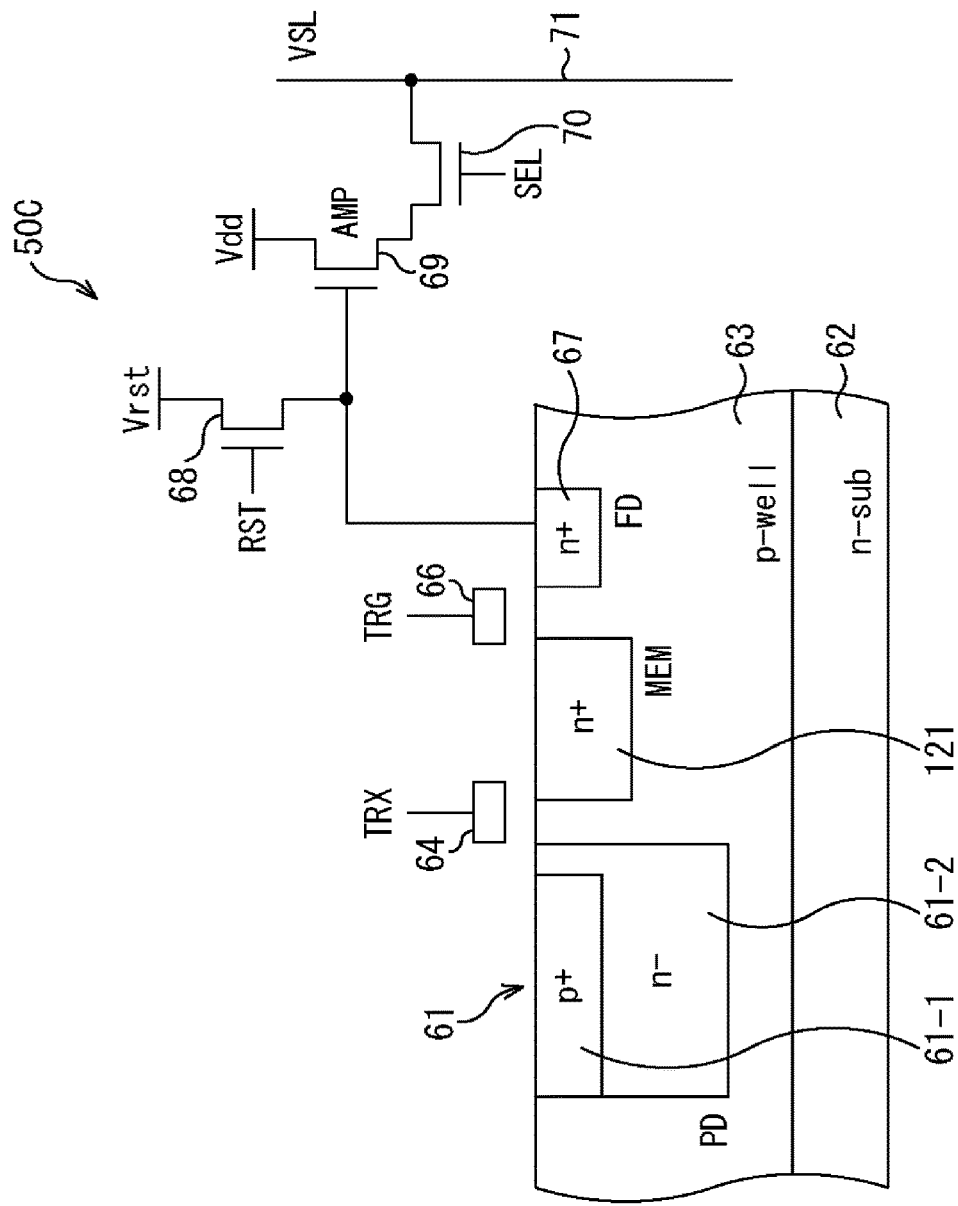
FIG. 10 is a schematic diagram showing still another configurational example of a unit pixel.

FIG. 10 is a schematic diagram showing still another configurational example of a unit pixel 50.

In the unit pixel 50C shown in FIG. 10, the gate electrode of the first transfer gate 64 is disposed above the p-type well layer 63 at the boundary between the photodiode 61 and a memory 121. The memory 121 includes an n-type layer which is of the same conductivity type as the floating diffusion region 67.

A CMOS image sensor incorporating unit pixels 50C thus constructed operates in the global shutter mode in the same manner and offers the same advantages as with the CMOS image sensor incorporating the unit pixels 50 shown in FIG. 2.

[Yet Another Structure of a Unit Pixel]

Figure 11:
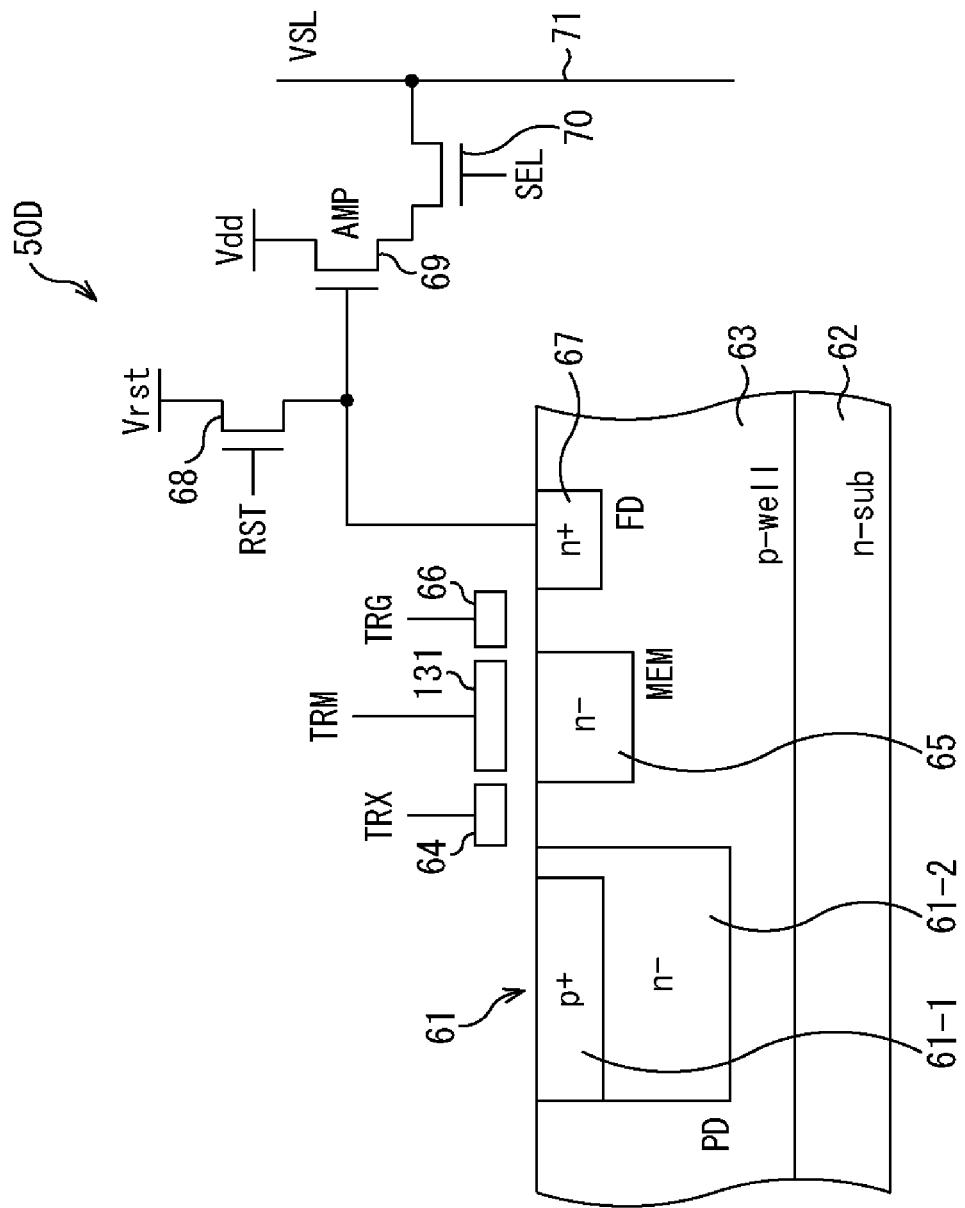
FIG. 11 is a schematic diagram showing yet another configurational example of a unit pixel.

FIG. 11 is a schematic diagram showing yet another configurational example of a unit pixel 50.

In the unit pixel 50D shown in FIG. 11, the gate electrode of the first transfer gate 64 is disposed above the p-type well layer 63 at the boundary between the photodiode 61 and the memory 65, and the gate electrode of a third transfer gate 131 is disposed above the memory 65.

The memory 65 is modulated by a drive signal TRM that is applied to the gate electrode of the third transfer gate 131. Specifically, when the drive signal TRM is applied to the gate electrode of the third transfer gate 131, the potential of the memory 65 becomes deeper.

The unit pixel 50D is therefore driven by the drive signal TRX, the drive signal TRM, the drive signal TRG, the drive signal RST, and the drive signal SEL which are supplied from the vertical driver 42.

[Driving Sequence Example of Unit Pixels]

A driving sequence example of the unit pixels 50D will be described below with reference to a timing chart shown in FIG. 12.

In the timing chart shown in FIG. 12, an operation sequence during a period from time T51 through time T53 is identical to the operation sequence during the period from time T1 through time T3 in the timing chart shown in FIG. 3, and will not be described below.

During a period from time T53 to time T54, concurrently in all the pixels, the charge stored in the photodiode 61 is transferred to the memory 65 and the floating diffusion region 67. During a period from time T53 to time T54, when the drive signals RST, TRG are turned on to initialize (reset) the charges stored in the memory 65 and the floating diffusion region 67.

Thereafter, during a period from time t11 through time t15, the first transfer gate 64 and the third transfer gate 131 are turned on, and the second transfer gate 66 is turned on to set the MEM-FD boundary potential to a predetermined potential, thereby transferring the charge stored in the photodiode 61 to the memory 65 and the floating diffusion region 67.

Details of operation of the unit pixel 50D during the period from time t11 through time t15 in the timing chart shown in FIG. 12 will be described below with reference to FIG. 13.

Figure 13:
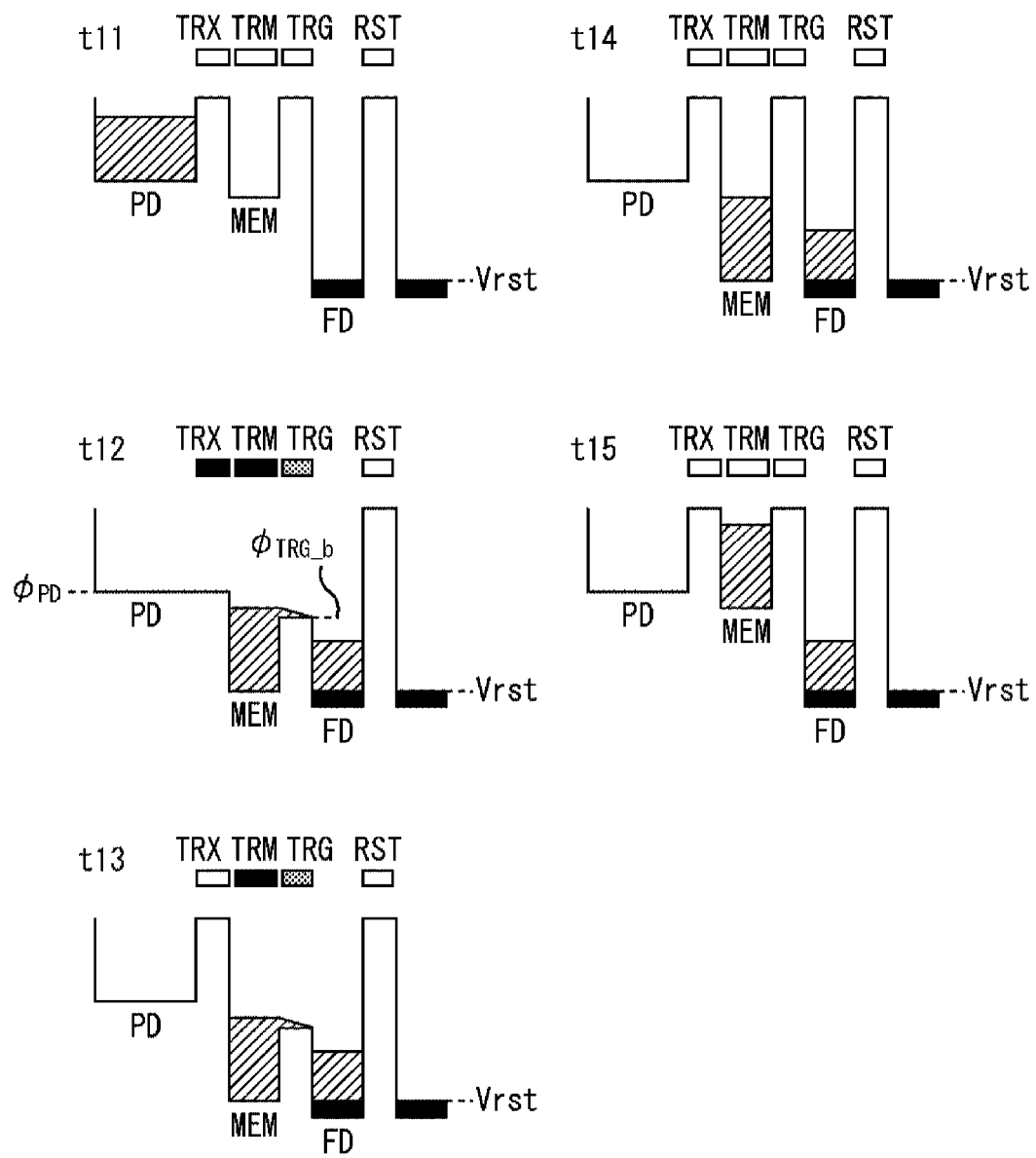
FIG. 13 is a potential diagram illustrative of a driving sequence example of the unit pixel.

FIG. 13 is a potential diagram showing potentials of the unit pixel 50D respectively at times t11 through t14. Quadrangles below the letters TRX, TRM, TRG, RST illustrate the states of the drive signals TRX, TRM, TRG, RST. A solid quadrangle indicates that the corresponding drive signal is turned on, and a blank quadrangle indicates that the corresponding drive signal is turned off. A stippled quadrangle indicates that the corresponding drive signal has a voltage between the voltage which is applied to turn it on and the voltage which is applied to turn it off.

At time t11, the unit pixel 50D is in a state wherein the photodiode 61 stores a charge and the memory 65 and the floating diffusion region 67 are initialized (reset).

Figure 12:
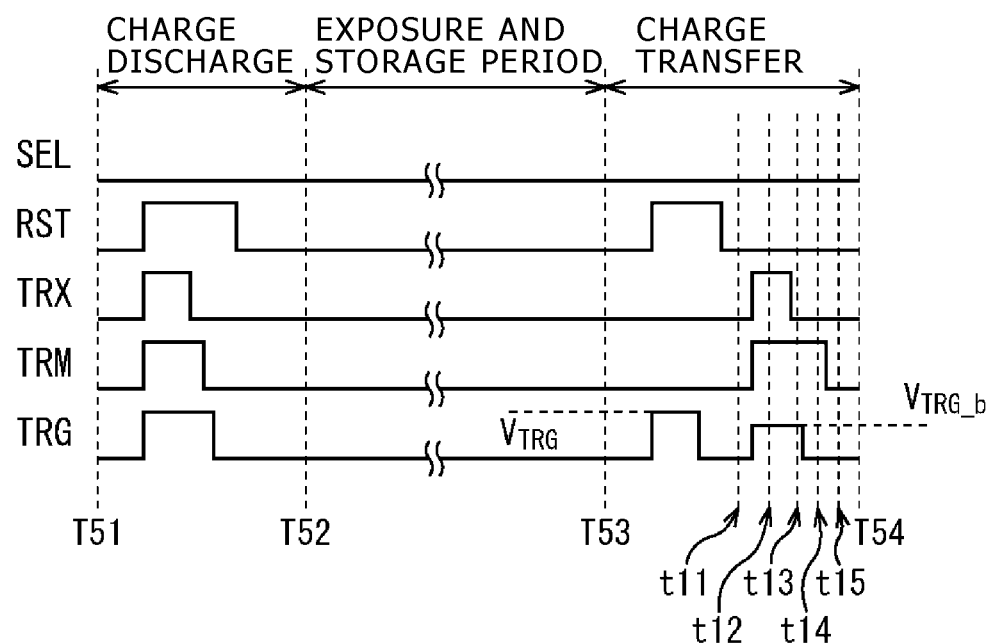
FIG. 12 is a timing chart illustrative of a driving sequence example of the unit pixel.

Then, the drive signal TRX (the first transfer gate 64) and the drive signal TRM (the third transfer gate 131) are turned on, and a pulse having a voltage $V_{TRG\_b}$ is applied as the drive signal TRG to the second transfer gate 66 (FIG. 12).

At time t12, in the unit pixel 50D, the PD-MEM boundary potential and the potential of the memory 65 are lowered to transfer the charge stored in the photodiode 61 to the memory 65 and to cause a charge in excess of the maximum charge quantity that can be held by the memory 65 to flow into the floating diffusion region 67.

In FIG. 12, the timing at which the drive signal TRX and the drive signal TRM are turned on and the timing at which the drive signal TRG of the voltage $V_{TRG\_b}$ is applied occur simultaneously. However, the timing at which the drive signal TRG is applied may be later than the timing at which the drive signal TRX and the drive signal TRM are turned on. In such a case, as the drive signal TRG is applied before the potential of the memory 65 becomes sufficiently low (sufficiently deep), an unnecessary charge is prevented from flowing into, i.e., being transferred to, the floating diffusion region 67.

Then, when the drive signal TRX (the first transfer gate 64) is turned off, the PD-MEM boundary potential returns to the level at time t11 at time t13. When the drive signal TRG (the second transfer gate 66) is turned off, the MEM-FD boundary potential returns to the level at time t11 at time t14. Thereafter, when the drive signal TRM (the third transfer gate 131) is turned off, the potential of the memory 65 returns to the level at time t11 at time t15.

The above operation of the unit pixel 50D offers the same advantages as the operation of the unit pixel 50 shown in FIG. 2.

[Yet Still Another Structure of a Unit Pixel]

Figure 14:
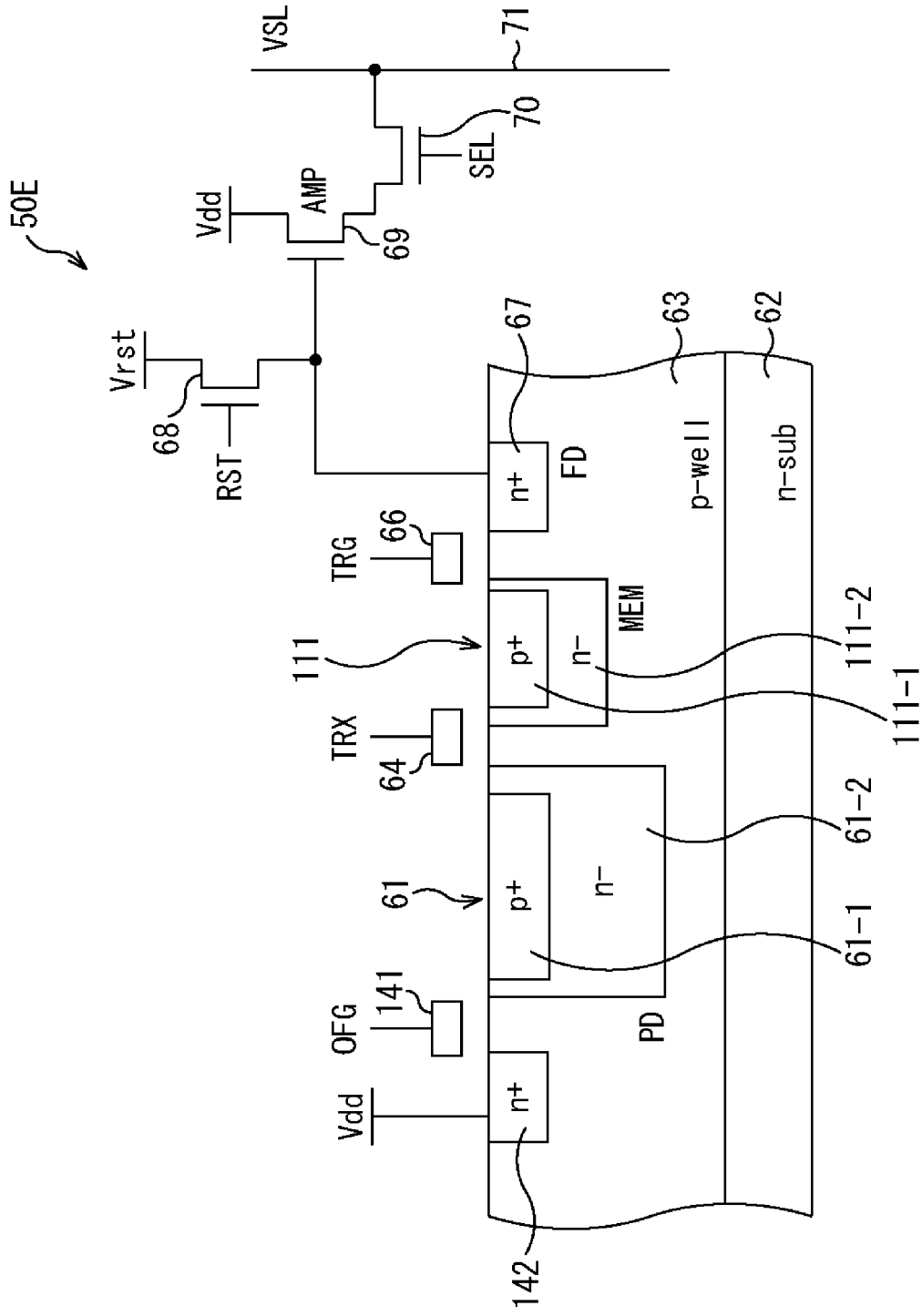
FIG. 14 is a schematic diagram showing still yet still another configurational example of a unit pixel.

A blooming prevention overflow gate may be added to the unit pixel 50B described with reference to FIG. 9, for example. FIG. 14 shows a unit pixel 50E with such a blooming prevention overflow gate. Those parts shown in FIG. 14 which are identical to those shown in FIG. 9 are denoted by identical reference characters, and will not be described in detail below.

As shown in FIG. 14, the unit pixel 50E additionally includes an overflow gate 141 and an n-type layer 142.

The overflow gate 141 discharges the charge stored in the photodiode 61 into the n-type layer 142 when a drive signal OFG is applied to the gate electrode of the overflow gate 141 at the time of starting an exposure period. A given voltage Vdd is applied to the n-type layer 142.

A CMOS image sensor incorporating unit pixels 50E thus constructed operates in the global shutter mode in the same manner and offers the same advantages as with the CMOS image sensor incorporating the unit pixels 50 shown in FIG. 2.

The overflow gate 141 incorporated in the unit pixel 50E shown in FIG. 14 may also be incorporated in the unit pixel 50 shown in FIG. 2, the unit pixel 50C shown in FIG. 10, and the unit pixel 50D shown in FIG. 11.

[Further Structure of a Unit Pixel]

Figure 15:
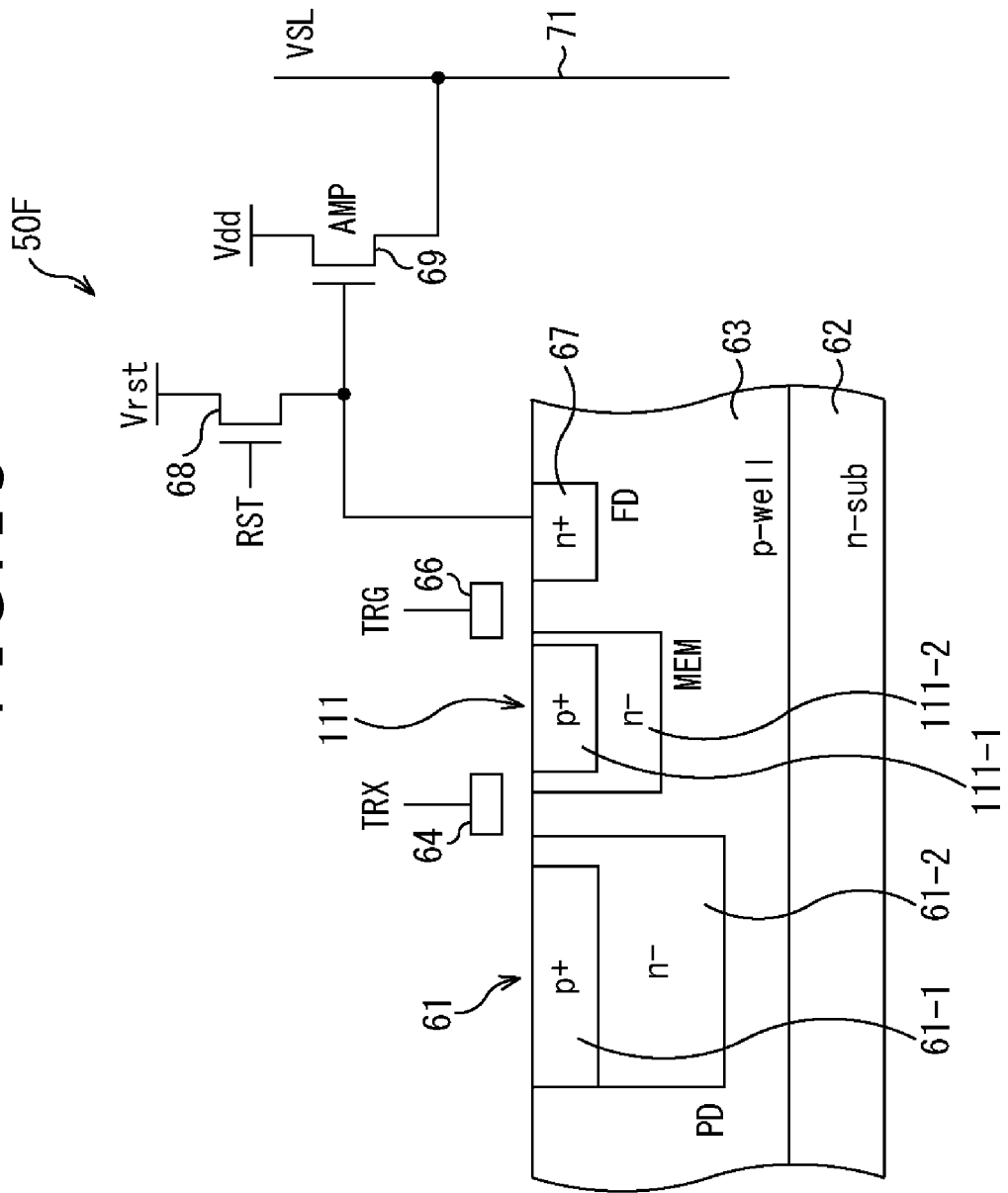
FIG. 15 is a schematic diagram showing a further configurational example of a unit pixel.

The selecting transistor 70 may be omitted from the unit pixel 50B described with reference to FIG. 9. FIG. 15 shows a unit pixel 50F from which a selecting transistor is omitted.

A CMOS image sensor incorporating unit pixels 50F thus constructed operates in the global shutter mode in the same manner and offers the same advantages as with the CMOS image sensor incorporating the unit pixels 50 shown in FIG. 2.

The selecting transistor 70 may also be omitted from the unit pixel 50 shown in FIG. 2, the unit pixel 50C shown in FIG. 10, the unit pixel 50D shown in FIG. 11, and the unit pixel 50E shown in FIG. 14.

In the operation of the unit pixel 50 to transfer a charge, the voltage $V_{TRG\_b}$ applied to the second transfer gate 66 is selected to set the MEM-FD boundary potential to the potential $\phi_{TRG\_b}$ that is lower than the potential $\phi_{PD}$ of the photodiode 61 in the depleted state. However, when the variation in the potential of the memory 65 which is caused when the drive signal TRX is turned on and the variation in the MEM-FD boundary potential which is caused when the drive signal TRG is turned on do not agree with each other, if the charge quantity that is left in the memory 65 at time t3 in FIG. 4 exceeds the maximum charge quantity of the memory 65 at the time the drive signal TRX is turned off, then a corresponding signal charge is lost at time t4.

[Another Driving Sequence Example of Unit Pixels]

A driving sequence example of the unit pixel 50 for preventing a signal charge in excess of the maximum charge quantity of the memory 65 from being lost will be described below with reference to a timing chart shown in FIG. 16.

In the timing chart shown in FIG. 16, an operation sequence during a period from time T71 through time T73 is identical to the operation sequence during the period from time T1 through time T3 in the timing chart shown in FIG. 3, and will not be described below.

During a period from time T73 to time T74, concurrently in all the pixels, the charge stored in the photodiode 61 is transferred to the memory 65 and the floating diffusion region 67. During a period from time T73 to time T74, when the drive signals RST, TRG are turned on to initialize (reset) the charges stored in the memory 65 and the floating diffusion region 67.

Thereafter, during a period from time t21 through time t25, the first transfer gate 64 is turned on, and the second transfer gate 66 is turned on to set the MEM-FD boundary potential to a predetermined potential, thereby transferring the charge stored in the photodiode 61 to the memory 65 and the floating diffusion region 67.

Details of operation of the unit pixel 50 during the period from time t21 through time t25 in the timing chart shown in FIG. 16 will be described below with reference to FIG. 17.

Figure 17:
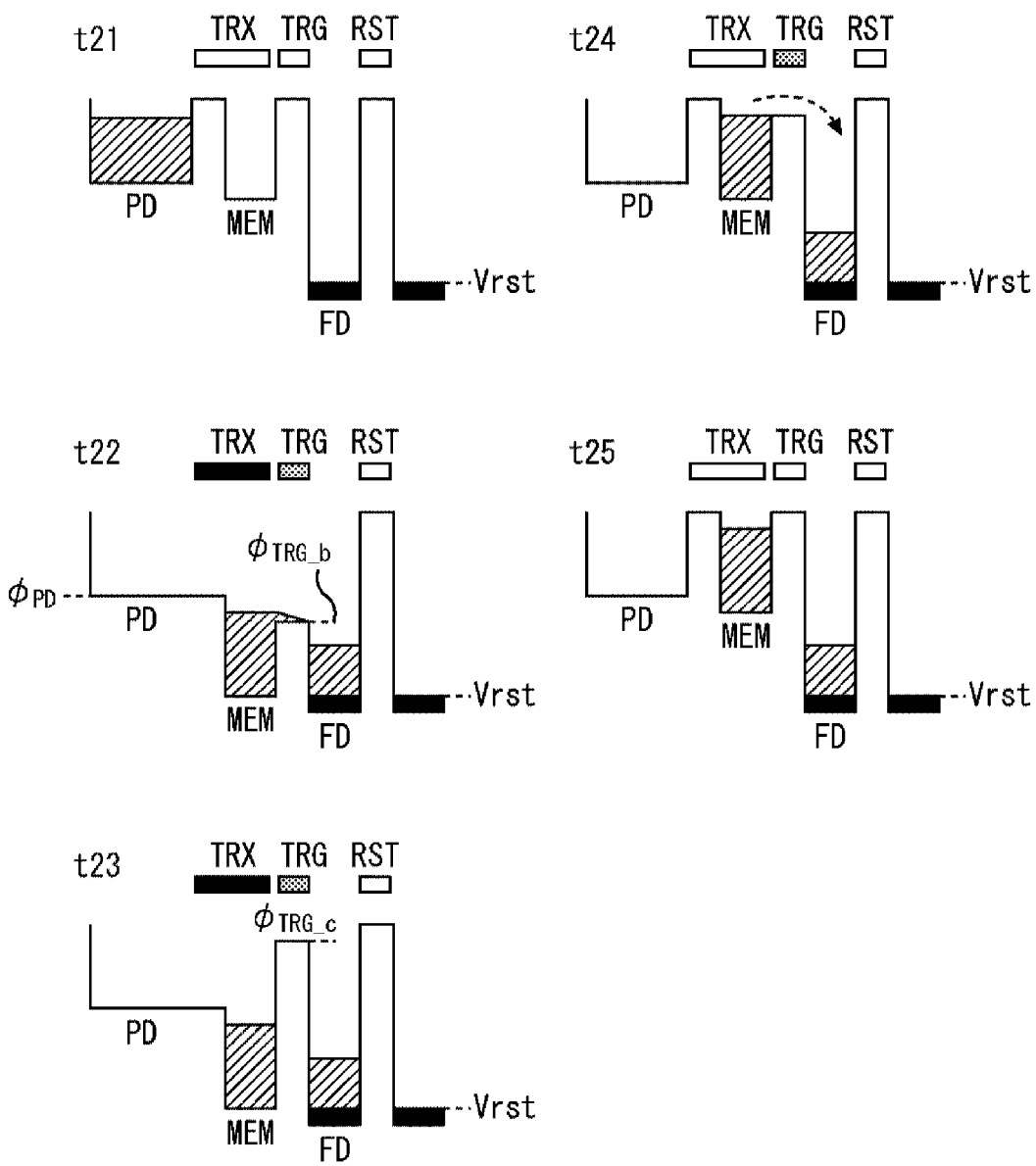
FIG. 17 is a potential diagram illustrative of a driving sequence example of the unit pixel.

FIG. 17 is a potential diagram showing potentials of the unit pixel 50 respectively at times t21 through t25. Quadrangles below the letters TRX, TRG, RST illustrate the states of the drive signals TRX, TRG, RST. A solid quadrangle indicates that the corresponding drive signal is turned on, and a blank quadrangle indicates that the corresponding drive signal is turned off. A stippled quadrangle indicates that the corresponding drive signal has a voltage between the voltage which is applied to turn it on and the voltage which is applied to turn it off.

Figure 16:
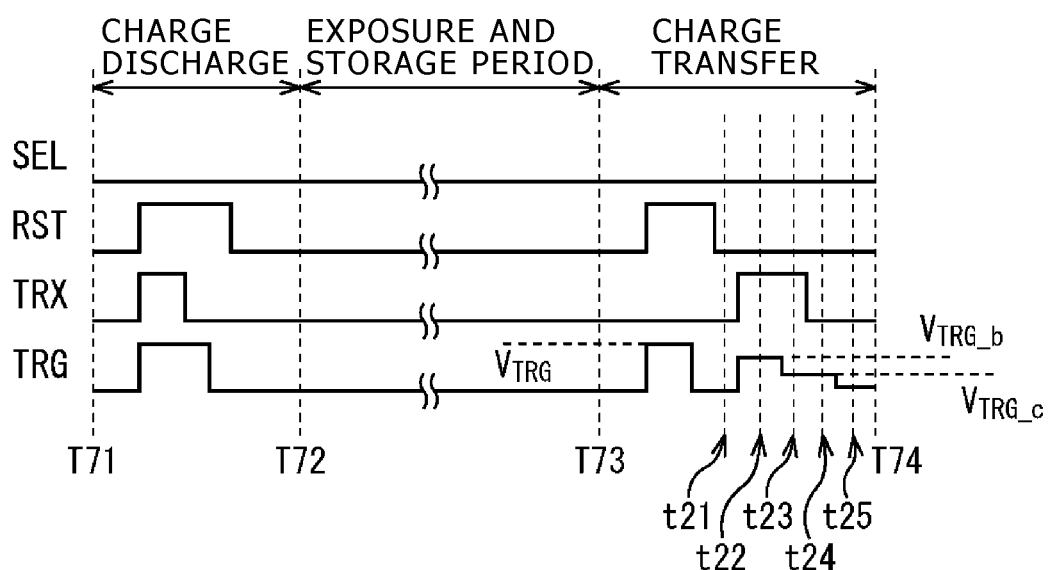
FIG. 16 is a timing chart illustrative of a driving sequence example of the unit pixel.

An operation sequence during a period from time t21 to time t22 in FIGS. 16 and 17 is identical to the operation sequence during the period from time t1 to time t2, and will not be described below.

From time t22, a pulse having a voltage $V_{TRG\_c}$ is applied as the drive signal TRG to the second transfer gate 66 (FIG. 16). The voltage $V_{TRG\_c}$ is a voltage which sets the MEM-FD boundary potential to a potential $\phi_{TRG\_c}$ that is higher than the potential $\phi_{TRG\_b}$ and lower than the PD-MEM boundary potential at the time the drive signal TRX is turned off.

At time t23, the MEM-FD boundary potential is thus set to the potential $\phi_{TRG\_c}$ that is higher than the potential $\phi_{TRG\_b}$ and lower than the PD-MEM boundary potential at the time the drive signal TRX is turned off.

Then, when the drive signal TRX (the first transfer gate 64) is turned off, the PD-MEM boundary potential and the potential of the memory 65 return the level at time t21 at time t24. At this time, even if the charge quantity left in the memory 65 at time t23 is in excess of the maximum charge quantity of the memory 65 at the time the drive signal TRX is turned off, a charge in excess of the maximum charge quantity that can be held by the memory 65 overflows into the floating diffusion region 67 from the potential barrier of a boundary between the memory 65 and the floating diffusion region 67 which is kept at the potential $\phi_{TRG\_c}$ that is lower than the PD-MEM boundary potential.

Thereafter, when the drive signal TRG (the second transfer gate 66) is turned off, the MEM-FD boundary potential returns to the level at time t21 at time t25.

According to the above driving sequence example, even if the charge quantity left in the memory 65 at the time the drive signal TRX is turned on is in excess of the maximum charge quantity of the memory 65 at the time the drive signal TRX is turned off, a corresponding signal charge is prevented from being lost, and hence the CMOS image sensor can operate in the global shutter mode for capturing moving images while at the same time maintaining the charge quantity handled thereby.

In the above driving sequence example, the MEM-FD boundary potential is set to the potential $\phi_{TRG\_c}$ that is lower than the PD-MEM boundary potential by controlling the voltage of the drive signal TRG. Rather, the MEM-FD boundary potential may be set to the potential $\phi_{TRG\_c}$ that is lower than the PD-MEM boundary potential by adjusting the structure of the unit pixel.

[Still Another Driving Sequence Example of Unit Pixels]

Figure 18:
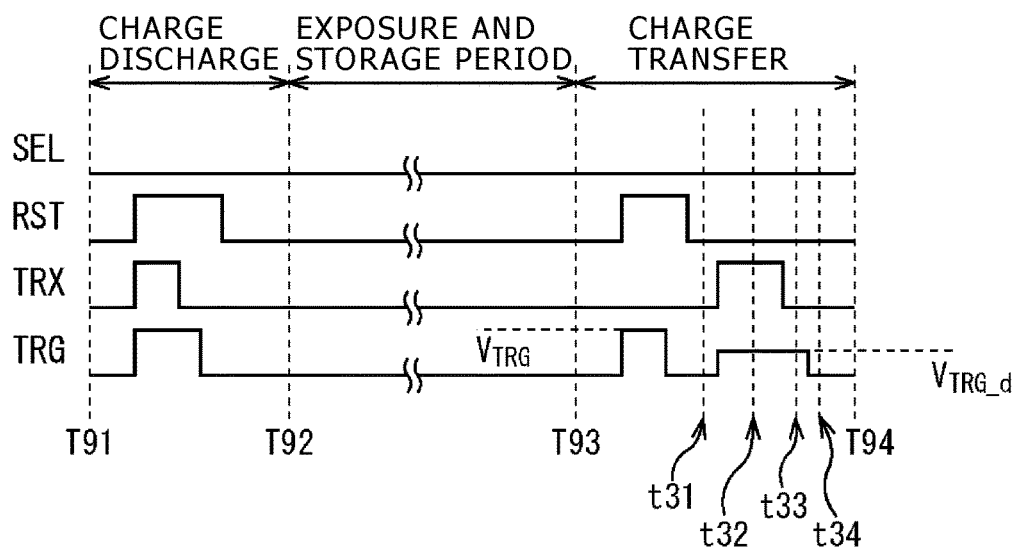
FIG. 18 is a timing chart illustrative of a driving sequence example of the unit pixel.

FIG. 18 is a timing chart illustrative of still another driving sequence example of the unit pixel 50.

In the timing chart shown in FIG. 18, an operation sequence during a period from time T91 through time T93 is identical to the operation sequence during the period from time T1 through time T3 in the timing chart shown in FIG. 3, and will not be described below.

During a period from time T93 to time T94, concurrently in all the pixels, the charge stored in the photodiode 61 is transferred to the memory 65 and the floating diffusion region 67. During a period from time T93 to time T94, when the drive signals RST, TRG are turned on to initialize (reset) the charges stored in the memory 65 and the floating diffusion region 67.

Thereafter, during a period from time t31 through time t34, the first transfer gate 64 is turned on to transfer the charge stored in the photodiode 61 to the memory 65 and the floating diffusion region 67.

Details of operation of the unit pixel 50 during the period from time t31 through time t34 in the timing chart shown in FIG. 18 will be described below with reference to FIG. 19.

Figure 19:
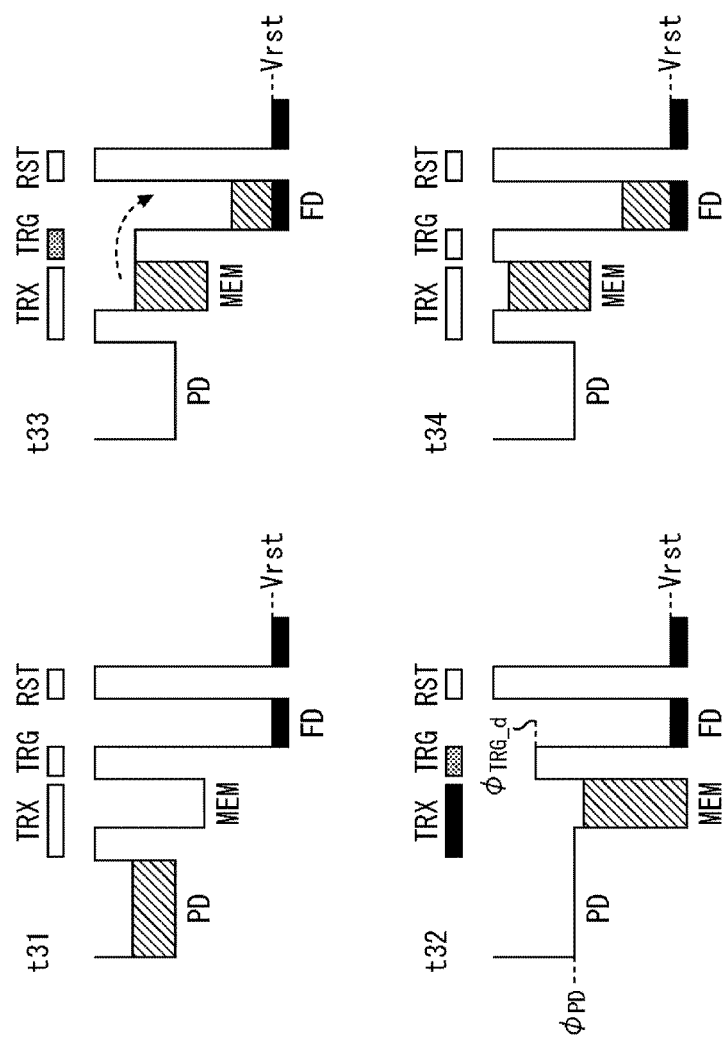
FIG. 19 is a potential diagram illustrative of a driving sequence example of the unit pixel.

FIG. 19 is a potential diagram showing potentials of the unit pixel 50 respectively at times t31 through t34. Quadrangles below the letters TRX, TRG, RST illustrate the states of the drive signals TRX, TRG, RST. A solid quadrangle indicates that the corresponding drive signal is turned on, and a blank quadrangle indicates that the corresponding drive signal is turned off. A stippled quadrangle indicates that the corresponding drive signal has a voltage between the voltage which is applied to turn it on and the voltage which is applied to turn it off.

At time t31, the unit pixel 50G is in a state wherein the photodiode 61 stores a charge and the memory 65 and the floating diffusion region 76 are initialized (reset).

Then, the drive signal TRX (the first transfer gate 64) is turned on, and a pulse having a voltage $V_{TRG\_d}$ is applied as the drive signal TRG to the second transfer gate 66 (FIG. 18). The voltage $V_{TRG\_d}$ is a voltage which is lower than a voltage $V_{TRG}$ of the drive signal TRG which is turned on, and is a voltage which sets the MEM-FD boundary potential to a potential $\phi_{TRG\_d}$ that is higher than the potential $\phi_{PD}$ of the photodiode 61 in a depleted state and lower than the PD-MEM boundary potential at the time the drive signal TRX is turned off, as shown in FIG. 19.

At time t32, in the unit pixel 50, the PD-MEM boundary potential and the potential of the memory 65 are lowered to transfer the charge stored in the photodiode 61 to the memory 65.

Then, when the drive signal TRX (the first transfer gate 64) is turned off, the PD-MEM boundary potential and the potential of the memory 65 return the level at time t31 at time t33. At this time, even if the charge quantity transferred to the memory 65 at time t32 is in excess of the maximum charge quantity of the memory 65 at the time the drive signal TRX is turned off, a charge in excess of the maximum charge quantity that can be held by the memory 65 overflows into the floating diffusion region 67 from the potential barrier of a boundary between the memory 65 and the floating diffusion region 67 which is kept at the potential $\phi_{TRG\_d}$ that is lower than the PD-MEM boundary potential.

Thereafter, when the drive signal TRG (the second transfer gate 66) is turned off, the MEM-FD boundary potential returns to the level at time t31 at time t34.

The driving sequence example shown in FIG. 18 thus makes the voltage amplitude of the floating diffusion region 67 greater than the driving sequence example shown in FIG. 3. Consequently, the configuration of the unit pixel 50 may be designed to reduce the capacity of the floating diffusion region 67 for an increased conversion efficiency.

[Configurational Examples of Electronic Instruments to which the Present Disclosure is Applicable]

The application of the present disclosure is not limited to solid-state image pickup devices. Rather, the present disclosure is applicable to all electronic instruments which include a solid-state image pickup device in an image pickup section (photoelectric transducer), including image pickup devices such as digital still cameras, video cameras, etc., portable terminal devices with an image pickup function, and copying machines including a solid-state image pickup device in an image reader. The solid-state image pickup device may be a one-chip device or a modular device with an image pickup function wherein an image pickup unit and a signal process or an optical system are packaged together.

Figure 20:
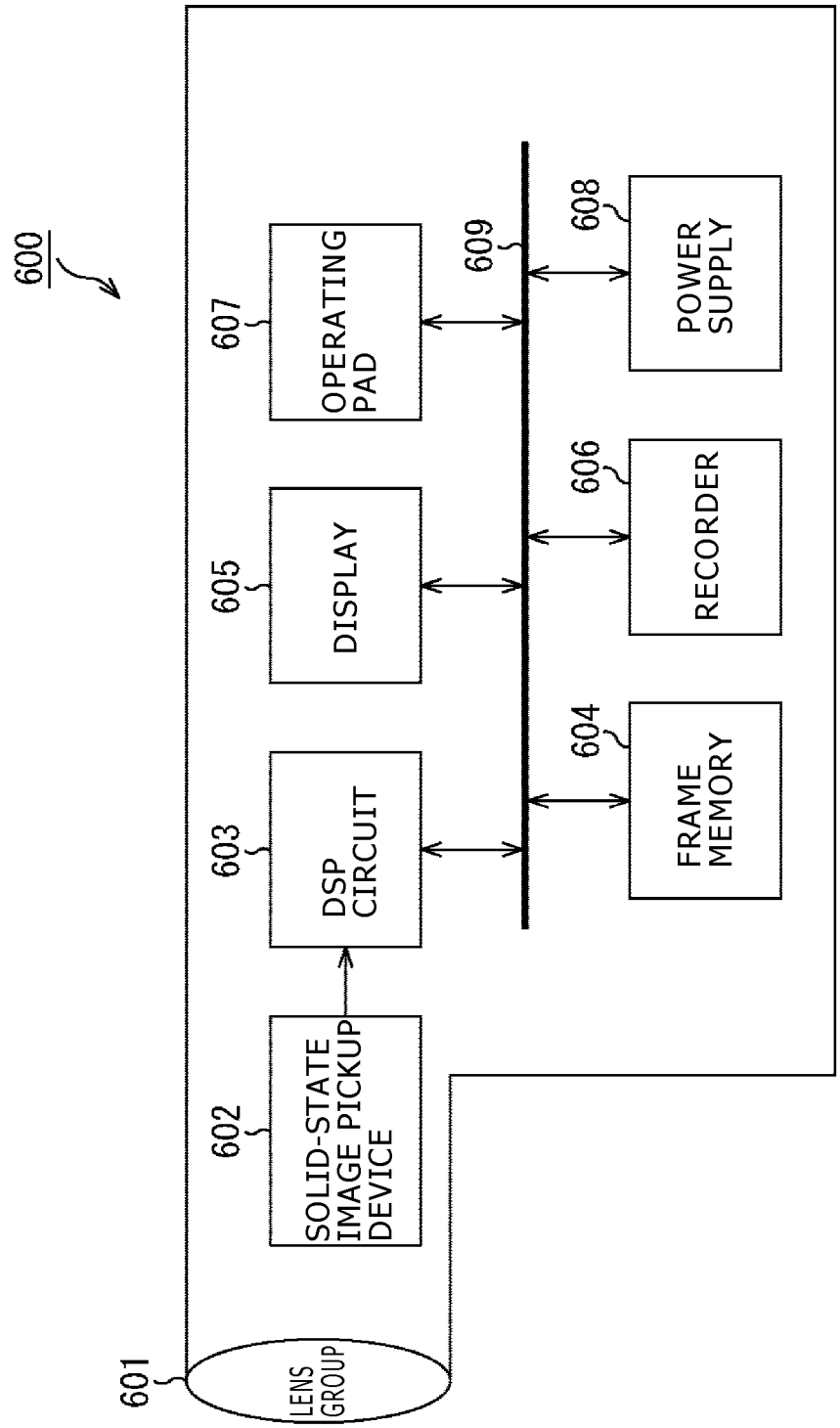
FIG. 20 is a block diagram of an electronic instrument according to an embodiment of the present disclosure.

FIG. 20 is a block diagram showing a configurational example of an image pickup apparatus as an electronic instrument according to an embodiment of the present disclosure.

As shown in FIG. 20, an image pickup apparatus 600 includes an optical system 601 having a lens group, a solid-state image pickup device (image pickup device) 602 incorporating any of the various versions of the unit pixels 50, and a DSP circuit 603 as a camera signal processing circuit. The image pickup apparatus 600 also includes a frame memory 604, a display 605, a recorder 606, an operating pad 607, and a power supply 608. The DSP circuit 603, the frame memory 604, the display 605, the recorder 606, the operating pad 607, and the power supply 608 are connected to each other by a bus line 609.

The optical system 601 introduces incident light (image light) from a subject and focuses the incident light onto the image pickup surface of the solid-state image pickup device 602. The solid-state image pickup device 602 converts the quantity of the incident light that is focused onto the image pickup surface by the optical system 601 into an electric signal pixel by pixel, and outputs the electric signal as a pixel signal. A solid-state image pickup device such as the CMOS image sensor 30 according to the above embodiment, i.e., a solid-state image pickup device which is capable of capturing distortion-free images in the global shutter mode, may be used as the solid-state image pickup device 602.

The display 605 is in the form of a panel-type display apparatus such as a liquid crystal panel, an organic EL (Electro-Luminescence) device, or the like, and displays moving images or still images that are captured by the solid-state image pickup device 602. The recorder 606 records the moving images or still images that are captured by the solid-state image pickup device 602 on a recording medium such as a video tape, a DVD (Digital Versatile Disk), or the like.

The operating pad 607 is operated by the user to issue operation commands with respect to various functions of the image pickup apparatus 600. The power supply 608 supplies various types of operating electric power to the DSP circuit 603, the frame memory 604, the display 605, the recorder 606, and the operating pad 607.

Since the CMOS image sensor 30 according to the above embodiment is used as the solid-state image pickup device 602, when charges are transferred, a charge in excess of the saturated charge quantity of the memory 65 as a charge holder is held by the floating diffusion region 67 as a charge voltage converter. Therefore, the solid-state image pickup device 602 can operate in the global shutter mode for capturing moving images while at the same time maintaining the charge quantity handled thereby. The solid-state image pickup device 602 is capable of increasing the quality of images, particularly moving images, captured by the image pickup apparatus 600 which may be a video camera, a digital still camera, or a camera module for use in a mobile device such as a mobile phone or the like.

In the above embodiment, the principles of the present disclosure are applied to a CMOS image sensor including a matrix of unit pixels arranged in rows and columns for detecting signal charges depending on the quantity of incident visible light as a physical quantity. The present disclosure is not limited to being applied to a CMOS sensor, but is also applicable to all solid-state image pickup devices of the column type which includes column processors associated with respective pixel columns of a pixel array.

The present disclosure is not limited to being applied to a solid-state image pickup device which captures an image by detecting a distribution of quantities of incident visible light. Rather, the present disclosure is also applicable to solid-state image pickup devices which capture an image by detecting a distribution of quantities of incident infrared rays, X-rays, or particles, and all solid-state image pickup devices (physical quantity distribution detecting devices), such as a fingerprint sensor, which capture an image by detecting a distribution of other physical quantities such as pressure, electrostatic capacitance, etc.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2010-279507 filed in the Japan Patent Office on Dec. 15, 2010, the entire content of which is hereby incorporated by reference.

What is claimed is:

1. A solid-state image pickup device, comprising:
   a plurality of pixels, each of said plurality of pixels including at least:

a photoelectric transducer,
a charge holder configured to hold a first charge stored in said photoelectric transducer,
a charge voltage converter configured to convert the first charge held by said charge holder into a first voltage,
a first transfer element configured to transfer the first charge from said photoelectric transducer to said charge holder,
a second transfer element configured to transfer a second charge from said charge holder to said charge voltage converter, and
a resetter configured to reset the second charge in said charge voltage converter; and
a drive controller configured to:
control driving of said plurality of pixels;
apply to said second transfer element, based on said first transfer element which is turned on by said drive controller, a transfer voltage configured to set potential of a potential barrier at a boundary between said charge holder and said charge voltage converter to a first potential which is higher than a second potential in a depleted state of a photodetector of said photoelectric transducer and which is lower than a third potential barrier around said charge holder;
turn off said first transfer element before said drive controller turns off said second transfer element from the transfer voltage; and
apply a negative voltage to said first transfer element and said second transfer element based on said first transfer element and said second transfer element which are turned off.

2. The solid-state image pickup device according to claim 1, further comprising:
a voltage reader configured to read a second voltage corresponding to the second charge in said charge voltage converter;
wherein said drive controller is further configured to control drive of said plurality of pixels to enable said voltage reader to:
read the second voltage as a first signal level corresponding to the second charge in said charge voltage converter,
read a third voltage as a reset level corresponding to the second charge in said charge voltage converter which is reset by said resetter, and
read the first voltage as a second signal level corresponding to the first charge transferred from said charge holder to said charge voltage converter by said second transfer element after the second charge in said charge voltage converter is reset by said resetter.

3. The solid-state image pickup device according to claim 2, further comprising:
a calculator configured to calculate a first difference between said first signal level and said reset level and a second difference between said second signal level and said reset level, and add said first difference and said second difference to each other.

4. The solid-state image pickup device according to claim 3, wherein said calculator is further configured to add said first difference and said second difference to each other based on said second signal level that is greater than a determined level.

5. A method, comprising:
in a solid-state image pickup device including:
a plurality of pixels, each of said plurality of pixels including at least a photoelectric transducer,
a charge holder configured to hold a first charge stored in said photoelectric transducer,
a charge voltage converter configured to convert the first charge held by said charge holder into a first voltage,
a first transfer element configured to transfer the first charge from said photoelectric transducer to said charge holder,
a second transfer element configured to transfer a second charge from said charge holder to said charge voltage converter, and
a resetter configured to reset the second charge in said charge voltage converter, and
a drive controller configured to control driving of said plurality of pixels, wherein said method comprises:
applying to said second transfer element, based on said first transfer element which is turned on by said drive controller, a transfer voltage configured to set potential of a potential barrier at a boundary between said charge holder and said charge voltage converter to a first potential which is higher than a second potential in a depleted state of a photodetector of said photoelectric transducer and which is lower than a third potential barrier around said charge holder;
turning off said first transfer element before said drive controller turns off said second transfer element from the transfer voltage; and
applying a negative voltage to said first transfer element and said second transfer element based on said first transfer element and said second transfer element which are turned off.

6. An electronic instrument, comprising:
a solid-state image pickup device including:
a plurality of pixels, each of said plurality of pixels including at least:
a photoelectric transducer,
a charge holder configured to hold a first charge stored in said photoelectric transducer,
a charge voltage converter configured to convert the first charge held by said charge holder into a first voltage,
a first transfer element configured to transfer the first charge from said photoelectric transducer to said charge holder,
a second transfer element configured to transfer a second charge from said charge holder to said charge voltage converter, and
a resetter configured to reset the second charge in said charge voltage converter; and
a drive controller configured to:
control driving of said plurality of pixels;
apply to said second transfer element, based on said first transfer element which is turned on by said drive controller, a transfer voltage configured to set potential of a potential barrier at a boundary between said charge holder and said charge voltage converter to a first potential which is higher than a second potential in a depleted state of a photodetector of said photoelectric transducer and which is lower than a third potential barrier around said charge holder;
turn off said first transfer element before said drive controller turns off said second transfer element from the transfer voltage; and apply a negative voltage to said first transfer element and said second transfer element based on said first transfer element and said second transfer element which are turned off.

* * * * *